US009865988B2

(12) United States Patent
Filgas et al.

(10) Patent No.: US 9,865,988 B2
(45) Date of Patent: Jan. 9, 2018

(54) HIGH-POWER PLANAR WAVEGUIDE (PWG) PUMPHEAD WITH MODULAR COMPONENTS FOR HIGH-POWER LASER SYSTEM

(71) Applicant: Raytheon Company, Waltham, MA (US)

(72) Inventors: David M. Filgas, Newbury Park, CA (US); Stephen H. McGanty, Hermosa Beach, CA (US); Christopher R. Koontz, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 22 days.

(21) Appl. No.: 15/233,238

(22) Filed: Aug. 10, 2016

(65) Prior Publication Data
US 2017/0353005 A1 Dec. 7, 2017

Related U.S. Application Data

(60) Provisional application No. 62/259,722, filed on Nov. 25, 2015.

(51) Int. Cl.
*H01S 3/02* (2006.01)
*G02B 6/00* (2006.01)
(Continued)

(52) U.S. Cl.
CPC ...... *H01S 5/02423* (2013.01); *H01S 5/02236* (2013.01); *H01S 5/02296* (2013.01);
(Continued)

(58) Field of Classification Search
CPC .... H01S 3/025; H01S 3/0315; H01S 5/02423; H01S 5/02236; H01S 5/2018; G02B 6/0011; G02B 6/0081; G02B 6/0085
See application file for complete search history.

(56) References Cited

U.S. PATENT DOCUMENTS 5,105,430 A 4/1992 Mundinger et al.
5,233,624 A * 8/1993 LaPlante ................. H01S 3/025
372/69

(Continued)

FOREIGN PATENT DOCUMENTS

EP 1003252 A2 5/2000
EP 1357647 A2 10/2003
(Continued)

OTHER PUBLICATIONS

International Search Report and Written Opinion of International Searching Authority dated Feb. 5, 2016 in connection with International Application No. PCT/US2015/055014, 8 pgs.
(Continued)

*Primary Examiner* — Eric Bolda

(57) ABSTRACT

A system includes a laser system having a master oscillator and a planar waveguide (PWG) amplifier having one or more laser diode pump arrays, a PWG pumphead, input optics, and output optics. The PWG pumphead is configured to receive a low-power optical beam from the master oscillator and generate a high-power optical beam. The PWG pumphead includes a laser gain medium, a cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, where the cartridge is removable from the housing.

20 Claims, 22 Drawing Sheets

(51) Int. Cl.
  *H01S 5/024* (2006.01)
  *H01S 5/022* (2006.01)
  *H01S 5/20* (2006.01)
  *H01S 5/04* (2006.01)
  *F21V 8/00* (2006.01)

(52) U.S. Cl.
  CPC ............ *H01S 5/041* (2013.01); *H01S 5/2018* (2013.01); *G02B 6/0011* (2013.01); *G02B 6/0081* (2013.01); *G02B 6/0085* (2013.01); *H01S 3/025* (2013.01)

(56) References Cited

U.S. PATENT DOCUMENTS

| | | | |
|---|---|---|---|
| 5,327,444 A | 7/1994 | Mooradian | |
| 5,363,391 A | 11/1994 | Matthews et al. | |
| 5,398,130 A | 3/1995 | Redman | |
| 5,778,132 A * | 7/1998 | Csipkes | H01S 3/06704 359/341.1 |
| 6,026,109 A | 2/2000 | Micke et al. | |
| 6,072,814 A * | 6/2000 | Ryan | G02B 6/4204 372/35 |
| 6,160,824 A | 12/2000 | Meissner et al. | |
| 6,417,955 B1 | 7/2002 | Kafka et al. | |
| 6,529,318 B1 * | 3/2003 | Kaneda | H01S 3/094003 359/341.32 |
| 6,690,696 B2 | 2/2004 | Byren et al. | |
| 6,738,396 B2 | 5/2004 | Filgas et al. | |
| 6,809,307 B2 | 10/2004 | Byren et al. | |
| 6,810,060 B2 | 10/2004 | Vetrovec | |
| 6,859,472 B2 | 2/2005 | Betin et al. | |
| 6,937,629 B2 | 8/2005 | Perry et al. | |
| 7,065,121 B2 * | 6/2006 | Filgas | B23K 26/402 372/10 |
| 7,472,741 B2 | 1/2009 | Johnson et al. | |
| 7,983,312 B2 | 7/2011 | Shkunov et al. | |
| 8,565,272 B2 | 10/2013 | Shkunov et al. | |
| 8,731,013 B2 | 5/2014 | Byren et al. | |
| 8,787,768 B2 | 7/2014 | Klotz et al. | |
| 8,977,097 B2 | 3/2015 | Filgas | |
| 9,014,226 B2 | 4/2015 | Perin | |
| 9,146,357 B2 * | 9/2015 | Wada | G02B 6/32 |
| 2002/0110166 A1 | 8/2002 | Filgas | |
| 2002/0118718 A1 | 8/2002 | Honea et al. | |
| 2003/0138021 A1 | 7/2003 | Hodgson et al. | |
| 2004/0028094 A1 | 2/2004 | Betin et al. | |
| 2004/0052280 A1 * | 3/2004 | Rice | H01S 3/0941 372/36 |
| 2006/0108098 A1 | 5/2006 | Stevanovic et al. | |
| 2006/0175041 A1 * | 8/2006 | Johnson | H01L 23/4735 165/80.2 |
| 2006/0227841 A1 | 10/2006 | Savich | |
| 2006/0263024 A1 | 11/2006 | Dong et al. | |
| 2008/0069160 A1 | 3/2008 | Stephens, IV | |
| 2008/0095204 A1 | 4/2008 | Miyajima et al. | |
| 2010/0195676 A1 | 8/2010 | Shakir et al. | |
| 2012/0051688 A1 | 3/2012 | Pitwon | |
| 2012/0103569 A1 | 5/2012 | Kim | |
| 2014/0212094 A1 * | 7/2014 | Wada | G02B 6/32 385/52 |
| 2014/0268309 A1 | 9/2014 | Strohkendi | |
| 2015/0378093 A1 | 12/2015 | Murgai | |
| 2016/0047981 A1 | 2/2016 | Filgas et al. | |
| 2016/0047982 A1 | 2/2016 | Filgas | |

FOREIGN PATENT DOCUMENTS

| | | |
|---|---|---|
| EP | 1492207 A2 | 12/2004 |
| WO | 0161799 A2 | 8/2001 |

OTHER PUBLICATIONS

Pearson et al., Applied Optics and Optical Engineering, edited by R. Shannon and J. Wyant, vol. VII, Chapter 8, "Adaptive Techniques for Wave-Front Correction", 1979, pp. 259-264.

P. McManamon et al., "Review of Phased Array Steering for Narrow-Band Electrooptical Systems", Proceedings of the IEEE, vol. 97, No. 6, Jun. 2009, pp. 1078-1096.

Filgas et al., "System and Method for Cooling a Laser Gain Medium Using an Ultra-Thin Liquid Thermal Optical Interface", U.S. Appl. No. 14/661,828, filed Mar. 18, 2015, 25 pgs.

Zamudio et al., "Techniques for Forming Waveguides for Use in Laser Systems or Other Systems and Associated Devices", U.S. Appl. No. 14/845,916, filed Sep. 4, 2015, 26 pgs.

Filgas et al., "Integrated Pumplight Homogenizer and Signal Injector for High-Power Laser System", U.S. Appl. No. 15/233,303, filed Aug. 10, 2016, 81 pgs.

Filgas et al., "High-Gain Single Planar Waveguide (PWG) Amplifier Laser System", U.S. Appl. No. 15/233,913, filed Aug. 10, 2016, 77 pgs.

Filgas et al., "Dual-Function Optical Bench and Cooling Manifold for High-Power Laser System", U.S. Appl. No. 15/233,928, filed Aug. 10, 2016, 80 pgs.

McGanty et al., "Planar Waveguides With Enhanced Support and/or Cooling Features for High-Power Laser Systems", U.S. Appl. No. 15/041,909, filed Feb. 11, 2016, 38 pgs.

Notification of International Search Report and the Written Opinion of the International Searching Authority dated Dec. 15, 2016 in connection with International Application No. PCT/US2016/049149, 12 pages.

Notification of International Search Report and the Written Opinion of the International Searching Authority dated Dec. 15, 2016 in connection with International Application No. PCT/US2016/049152, 15 pages.

Notification of International Search Report and the Written Opinion of the International Searching Authority dated Dec. 15, 2016 in connection with International Application No. PCT/US2016/049151, 12 pages.

Notification of International Search Report and the Written Opinion of the International Searching Authority dated Dec. 15, 2016 in connection with International Application No. PCT/US2016/049146, 15 pages.

David Filgas, et al., "Recent Results for the Raytheon RELI Program", Laser Technology for Defense and Security VIII, SPIE, vol. 8381, No. 1, Bellingham, Washington, May 11, 2012, 8 pages.

Office Action dated Mar. 10, 2017 in connection with U.S. Appl. No. 15/041,909, 18 pages.

Website https://merriam-webster.com/dictionary/seal, retrieved on Mar. 2, 2017, 15 pages.

* cited by examiner

HIGH-POWER PLANAR WAVEGUIDE (PWG) PUMPHEAD WITH MODULAR COMPONENTS FOR HIGH-POWER LASER SYSTEM

CROSS-REFERENCE TO RELATED APPLICATION AND PRIORITY CLAIM

This application claims priority under 35 U.S.C. §119(e) to U.S. Provisional Patent Application No. 62/259,722 filed on Nov. 25, 2015. This provisional application is hereby incorporated by reference in its entirety.

TECHNICAL FIELD

This disclosure is generally directed to high-power laser systems. More specifically, this disclosure is directed to a high-power planar waveguide (PWG) pumphead with modular components for a high-power laser system.

BACKGROUND

High-power laser systems are being developed for a number of military and commercial applications. Many conventional high-power laser systems use laser pumpheads in which cooling elements are simply clamped to laser gain media. However, this approach typically does not achieve necessary or desired cooling efficiencies and cooling uniformities needed for high-power operation, nor does this approach provide low mounting stresses. Hot spots in a laser gain medium, coupled with mechanical mounting stresses, can result in degradation of laser performance or even fracturing of the laser gain medium.

SUMMARY

This disclosure provides a high-power planar waveguide (PWG) pumphead with modular components for a high-power laser system.

In a first embodiment, an apparatus includes a PWG pumphead configured to receive a low-power optical beam and generate a high-power optical beam. The PWG pumphead includes a laser gain medium, a cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, and the cartridge is removable from the housing.

In a second embodiment, a system includes a laser system having a master oscillator and a PWG amplifier having one or more laser diode pump arrays, a PWG pumphead, input optics, and output optics. The PWG pumphead is configured to receive a low-power optical beam from the master oscillator and generate a high-power optical beam. The PWG pumphead includes a laser gain medium, a cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, where the cartridge is removable from the housing.

In a third embodiment, a method includes inserting a cartridge into a PWG pumphead of a laser system. The PWG pumphead is configured to receive a low-power optical beam and generate a high-power optical beam. The PWG pumphead includes a laser gain medium, the cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, and the cartridge is removable from the housing.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 17, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
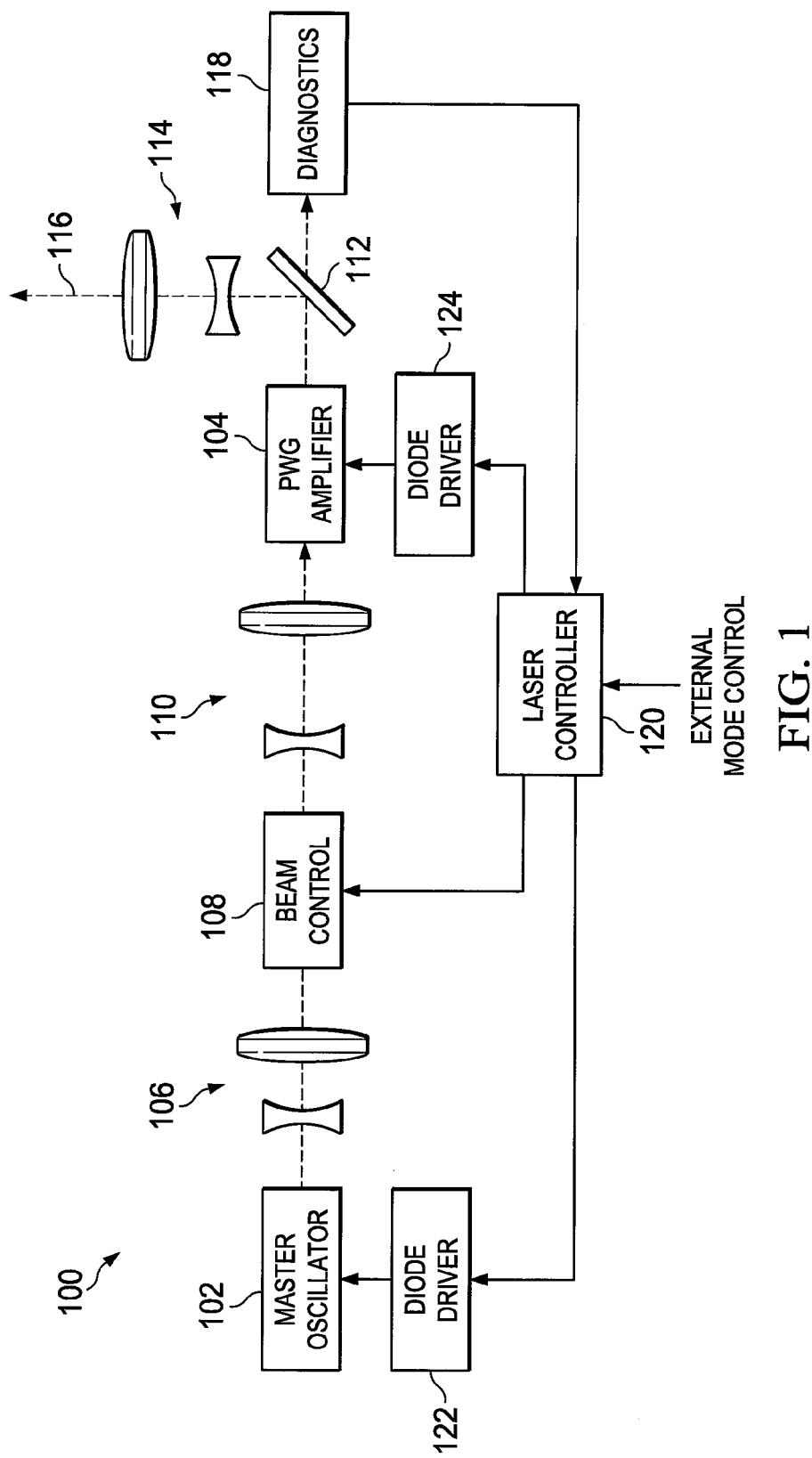
FIG. 1 illustrates an example high-power laser system according to this disclosure.

FIG. 1 illustrates an example high-power laser system 100 according to this disclosure. As shown in FIG. 1, the laser system 100 includes a master oscillator 102 and a planar waveguide (PWG) amplifier 104. The laser system 100 therefore has a master oscillator/power amplifier (MOPA) configuration.

The master oscillator 102 generally operates to generate low-power optical signals. The low-power optical signals could denote any suitable optical signals having relatively low power. For example, the low-power optical signals could include optical signals having a continuous wave (CW) output, a continuous pulse train (CPT), a pulse burst, or any of various other waveforms. The master oscillator 102 includes any suitable structure(s) for generating one or more low-power optical signals. In some embodiments, the master oscillator 102 includes a fiber laser.

The PWG amplifier 104 receives the low-power optical signals from the master oscillator 102 and pump power. The PWG amplifier 104 generally operates to amplify the low-power optical signals and generate high-power optical signals. For example, the PWG amplifier 104 could amplify a low-power CW or other optical signal into a high-power CW or other optical signal having ten kilowatts of power or more. The received pump power provides the necessary population inversion in the PWG amplifier's gain medium for this amplification.

The gain medium of the PWG amplifier 104 is formed using a planar waveguide. A planar waveguide generally denotes a structure that includes a core region and one or more cladding layers. The core region is doped with an active ion species responsive to optical signals of at least one specific wavelength, and the one or more cladding layers are optically transparent and contact the core region. The indexes of refraction and dielectric constants of the core region and the cladding layer(s) differ and create boundaries that reflect the optical signals. The planar waveguide therefore operates to guide optical signals in its narrower dimension (referred to as the "fast axis" direction) but not in its broader dimension (referred to as the "slow axis" direction). The planar waveguide could be formed from any suitable materials and in any suitable manner.

Relay optics 106 direct the optical signals from the master oscillator 102 into a beam controller 108, and relay optics 110 direct the optical signals from the beam controller 108 into the PWG amplifier 104. The relay optics 106 and 110 can also alter the cross-sectional dimensions of the optical signals as needed for injection into the beam controller 108 and the PWG amplifier 104, respectively. Each of the relay optics 106 and 110 includes any suitable optical device(s) for directing or formatting optical signals.

The beam controller 108 generally operates to modify the optical signals from the master oscillator 102 before the optical signals reach the PWG amplifier 104. For example, the beam controller 108 could pre-distort the phase profile of the optical signals from the master oscillator 102 in order to substantially or completely compensate for optical phase distortions created within the PWG amplifier 104. The beam controller 108 could also pre-distort both the amplitude and phase of the optical signals from the master oscillator 102. The beam controller 108 could further include separate control devices for two-axis tip/tilt alignment control and higher-order beam control. The beam controller 108 includes any suitable structure(s) for pre-distorting or otherwise modifying optical signals in a controllable manner.

The high-power output beam generated by the PWG amplifier 104 is directed towards a beam splitter 112. The beam splitter 112 provides a substantial portion of the high-power output beam to relay optics 114, which provide that portion of the high-power output beam out of the laser system 100 as a high-power output beam 116. The beam splitter 112 also provides a small amount of the high-power output beam as samples to a feedback loop. The feedback loop is used to control and modify operation of the master oscillator 102, the PWG amplifier 104, and the beam controller 108. The beam splitter 112 includes any suitable structure(s) for splitting optical signals. The relay optics 114 include any suitable optical device(s) for directing or formatting optical signals.

The feedback loop here includes a diagnostics unit 118, a laser controller 120, and diode drivers 122-124. The diagnostics unit 118 generally operates to analyze the samples of the high-power output beam from the PWG amplifier 104. The diagnostics unit 118 includes any suitable structure for identifying one or more characteristics of at least one sample of a high-power output beam. For example, the diagnostics unit 118 could include a one-dimensional (1D) wavefront sensor configured to sense phase distortions in the high-power output beam across the slow axis of the PWG amplifier 104. As a particular example, a 1D Shack-Hartman sensor could include a linear cylindrical lens array and a 1D semiconductor photodetector array. As another example, the samples of the high-power output beam may be focused through a slit in the slow axis such that only a fraction of the portion of the beam profile that is of high beam quality passes. This portion can be sensed by a single photodetector to measure what may be called the 1D "power in the bucket" (PIB), which denotes far field beam quality measurements. As yet another example, the samples can be split yet again, with one part reimaged on a wavefront sensor and another part focused through a slit onto a PIB detector. As still another example, the slit and the PIB sensor could be replaced with a linear array configured to measure the PWG exit beam profile in the slow axis.

The laser controller 120 uses data from the diagnostics unit 118 to determine how to adjust operation of the laser system 100. For example, the laser controller 120 may include a 1D adaptive optics (AO) processor configured to process wavefront or PIB information and send control commands to a 1D beam control device within the beam controller 108. The beam control device could pre-distort the phasefront of the master oscillator's output in the slow axis direction to compensate for phase distortions created in the PWG amplifier 104. As another example, the laser controller 120 may include or support one or more back-propagation algorithms to adjust the pre-distortion signal for improved wavefront correction at the output of the PWG amplifier 104. The laser controller 120 may further include a mechanism to jump-start the wavefront correction process based on other diagnostics data. Note that while shown here as residing before the PWG amplifier 104, other or additional beam control functions could be located after the PWG amplifier 104 and controlled by the laser controller 120. If the beam controller 108 includes separate control devices for two-axis tip/tilt alignment control and higher-order beam control, alignment sensors included along the beam path may provide additional information to the laser controller 120 for use in controlling the laser beam in tip/tilt and translation. Specific examples of the types of control algorithms that could be supported by the laser controller 120 are described in U.S. Provisional Patent Application No. 62/266,507 filed on Dec. 11, 2015 and entitled "PLANAR WAVEGUIDE (PWG) AMPLIFIER-BASED LASER SYSTEM WITH CORRECTION IN LOW-POWER BEAM PATH" (which is hereby incorporated by reference in its entirety). The laser controller 120 can also respond to mode control commands from one or more external sources, such as control commands for initiating cooling or for initiating or ceasing laser action.

The laser controller 120 includes any suitable structure for controlling operation of a laser system. For example, the laser controller 120 could include one or more processing devices, such as one or more microprocessors, microcontrollers, digital signal processors, field programmable gate arrays, application specific integrated circuits, or discrete logic devices. The laser controller 120 could also include one or more memories configured to store instructions or data used, generated, or collected by the processing device (s). The laser controller 120 could further include one or more interfaces configured to facilitate communications with other components or systems.

The diode driver 122 generates electrical drive signals that cause one or more laser diodes (or other light sources) of the master oscillator 102 to generate optical pump power for the master oscillator 102, which causes the master oscillator 102 to generate desired low-power optical signals. The diode driver 124 generates electrical drive signals that cause laser diodes (or other light sources) of the PWG amplifier 104 to generate optical pump power for the PWG amplifier 104, which uses the pump power to provide optical amplification. The diode driver 124 could be capable of operation across a range of input voltages and load conditions while protecting expensive laser diode strings from electrical shorts and transients. Each diode driver 122-124 includes any suitable structure(s) for driving any suitable arrangement of laser diodes or other light sources. As a particular example, each diode driver 122-124 could include (i) two parallel-arranged buck regulators that receive the same input voltage and (ii) two parallel-arranged series resonant DC/DC converters that each receives the outputs of both buck regulators and are driven in quadrature (90 degrees out of phase with each other), where the current outputs of the DC/DC converters are summed and provided to the laser diodes of the master oscillator 102 or PWG amplifier 104.

In some embodiments, diagnostic data from the diagnostics unit 118 could be output by the laser controller 120, such as to one or more external destinations. This could allow the external destinations to monitor the health, status, or safety of the laser system 100. Also, in some embodiments, the laser controller 120 may run background and commanded built-in-test (BIT) routines to monitor the health, status, or safety of the laser system 100, predict the need for unscheduled maintenance, perform start-up sequencing, and/or shut the laser system 100 down if parameters are out of safety tolerance. Shutdown commands may also be received from an external source. In the event of a shutdown command, the laser controller 120 commands the master oscillator 102 and diode drivers 122-124 to turn off, and components such as fast reflective shutters may be used to divert residual laser power into a cooled beam dump (not shown).

The laser system 100 can incorporate a number of novel features, which are described below. These novel features can be used individually or in any suitable combination. One novel feature involves the use of a single PWG amplifier 104 in a single amplifier beamline. Many conventional high-power laser systems use one or more laser amplifier beamlines, where each beamline includes multiple large and relatively low-gain laser amplifiers that collectively provide a large amount of gain for amplification. Using this conventional approach to achieve high thresholds of laser energy could require a room full of laser amplifier equipment. The size, weight, and complexity associated with multiple high-power solid-state amplifier elements in a conventional MOPA configuration are inconsistent with many applications.

Fiber lasers are capable of achieving high stimulated emission gain over a very long path by confining a signal beam being amplified within a low-order propagating mode. Beam quality is preserved in both dimensions because the fiber is very lossy for any mode other than the lowest order due to the small numerical aperture of its waveguide. However, conventional round fibers, even those with a large mode area, typically cannot handle average power much above one kilowatt with good beam quality. A semi-guiding high aspect ratio (SHARC) fiber laser is capable of scaling up to much higher power levels with very good beam quality compared to traditional round fibers. The fast axis of the SHARC fiber confines a beam to its lowest order mode, thereby providing near diffraction-limited beam quality in that dimension. While the slow axis is unguided, the gain is high for only the most collimated rays since all others experience significant loss and are not amplified for any appreciable distance down the SHARC fiber. High beam quality is therefore preserved after amplification in the slow axis, as well.

PWG lasers guide in one axis and are lossy in the other axis, so PWG lasers provide some of the benefits of the SHARC fiber laser with the added benefit of a more traditional manufacturing approach and more robust crystalline components. The laser system 100 of FIG. 1 can include a single high-gain PWG amplifier in a MOPA configuration. The PWG amplifier 104 could include a single planar waveguide supported, cooled, and optically pumped within a single compact pumphead. The PWG amplifier 104 inherently provides high beam quality in its guided or fast axis, so no beam correction may be needed in this axis. High-order beam control may be needed only in the orthogonal slow axis of the PWG amplifier 104, such as to correct for phase distortions from non-uniform cooling across the slow axis of the PWG amplifier 104 and mechanical/thermal stresses within the PWG amplifier 104 (which may produce index variations).

As another example novel feature, an optical bench may be used in conjunction with various components of the laser system 100. In many conventional high-power laser systems, the optical bench represents a stiff component designed to keep optical components of the laser systems in optical alignment. Cooling is typically provided by a separate system. Cooling channels are not typically used in the optical bench because temperature differences would warp or otherwise deform the optical bench, causing misalignment of critical optical components.

As described below, the laser system 100 could include a PWG pumphead assembly in which optical alignment is maintained by mounting various optical components to the PWG amplifier 104. An integrated optical bench and cooling manifold can be used to support the overall structure and to provide coolant to the overall structure. The optical bench could be implemented using a baseplate that can deform with little or no effect on the alignment of the optical components. This deformation can occur due to, for example, changes in temperature of a coolant as the coolant flows through different components and different portions of the optical bench. Because the various optical components can be mounted to a housing of the PWG amplifier 104 to help maintain optical alignment of these components, minor deformations of the optical bench may not interfere with proper operation of the laser system 100.

As yet another example novel feature, one or more components of the laser system 100 could be implemented as one or more cartridges that are inserted into a pumphead or attached to an optical bench. For example, the laser gain medium of the PWG amplifier 104 could be implemented in one cartridge, and the laser diodes of the PWG amplifier 104 could be implemented in another cartridge. Moreover, one or more of the cartridges may require a high clamping force to secure the cartridge(s), and mechanisms for providing this high clamping force are described below. Among other things, this cartridge-based approach allows different cartridge designs to be installed with common (possibly standardized) mechanical, thermal, electrical, and optical interfaces without making any changes to the pumphead and optical bench. Also, different design teams can create and test different designs for the various components of the laser system 100. There may be little or no need for one design team to wait for the development of one component of the laser system 100 to be completed before designing and testing another component of the laser system 100.

As still another example novel feature, the PWG pumphead assembly could incorporate a homogenizing element for homogenizing the pumplight supplied by laser diodes or other light sources. The homogenizing element can also help to manage stray light from the light sources that does not properly couple into the PWG amplifier 104. This supports the injection of a stable beam into the PWG amplifier 104 while avoiding alignment stability concerns and decreasing component counts.

The laser system 100 could incorporate any number of additional novel features as needed or desired. For example, the laser system 100 could use the techniques disclosed in U.S. patent application Ser. No. 14/661,828 and U.S. Patent Publication No. 2014/0268309 (which are hereby incorporated by reference) to cool various components of the laser system 100, including the use of a thermal-optic interface (TOI) material. The laser system 100 could use the techniques disclosed in U.S. Patent Publication No. 2014/0268309 to suppress amplified spontaneous emission (ASE) within a PWG device, including the use of beveled edges on the PWG device. The laser system 100 could use the techniques disclosed in U.S. patent application Ser. No. 14/682,539 (which is hereby incorporated by reference), including the use of symmetric and asymmetric core regions in PWG devices. The laser system 100 could use the techniques disclosed in U.S. patent application Ser. No. 14/749,398 (which is hereby incorporated by reference), including the use of asymmetric two-layer PWG devices. The PWG amplifier 104 of the laser system 100 could be formed using the techniques disclosed in U.S. patent application Ser. No. 14/845,916 (which is hereby incorporated by reference), including the use of radio frequency (RF) magnetron sputtering and other techniques to form PWG-based laser devices.

Other features could also be included in the laser system 100. For example, finite element structural and thermal modeling of a PWG pumphead assembly in the laser system 100 could be used to determine characteristics of deformation modes. This could include identifying amplitude, frequency, order, and specific modal shape of the deformation modes under shock, vibration, acoustic, and thermal stimulation. The precise locations of resonant nodes and antinodes of the structure can be identified, and alignment-sensitive components (such as lenses, apertures, beam splitters, light pipes, and lasing media) could be placed at or near specified nodes or anti-nodes in the pumphead assembly. The elements can be placed in relationship to the nodes and anti-nodes of the structure in order to optimize their performance and minimize their misalignment along critical directions and axes.

As another example, the PWG amplifier 104 could have an asymmetric planar waveguide, where the core region is closer to a first side of the planar waveguide than to a second side of the planar waveguide (such as when cladding layers on opposite sides of the core region have different thicknesses). Different cooling techniques could be used along the first and second sides of the planar waveguide. As particular examples, a multi jet liquid impingement cooler could be used for direct liquid cooling of the first side of the planar waveguide. A cooler module that uses a flow of coolant could be used to cool the second side of the planar waveguide through a TOI material. Alternatively, one or more plates or other cooling devices could be coupled to opposing surfaces of the planar waveguide.

Overall, the laser system 100 combines the benefits of fiber lasers (such as high gain with good beam quality) and bulk solid-state lasers (such as scalability) in an overall laser architecture that supports the generation of high-power laser outputs. The PWG amplifier 104 functions as a lasing element that facilitates high gain over a long amplifier path while simultaneously maintaining near diffraction-limited beam quality in one dimension (the fast axis of the PWG amplifier 104). Substantially uniform pumping of the lasing medium and substantially uniform cooling of the core region combine to produce a reasonably high-quality beam in the transverse dimension (the slow axis of the PWG amplifier 104).

Although FIG. 1 illustrates one example of a high-power laser system 100, various changes may be made to FIG. 1. For example, any single feature or combination of features described above could be used in the laser system 100. As particular examples, the laser system 100 could include more than one gain medium in one or more PWG amplifiers, omit the use of an optical bench with cooling channels, omit the use of a homogenizing element, or not support the use of cartridges.

Figure 2:
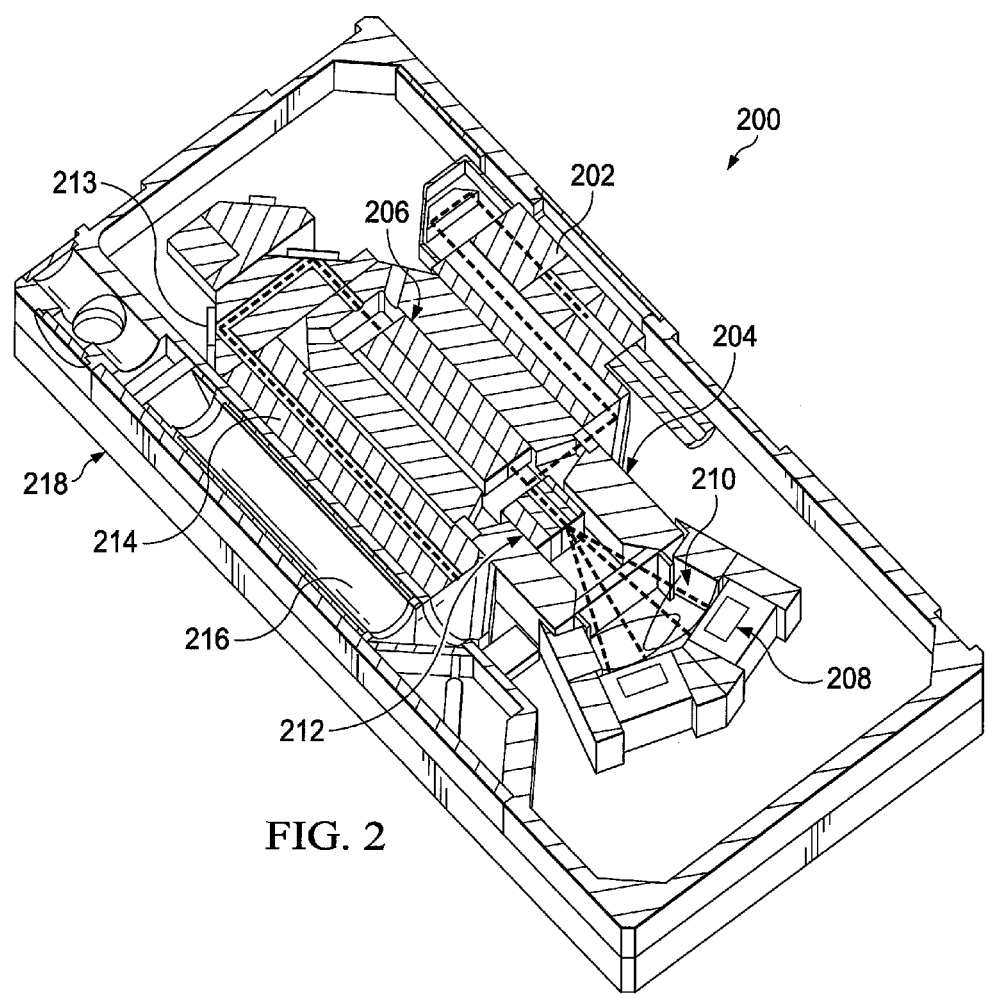
FIG. 2 illustrates an example packaged high-power laser system according to this disclosure.

FIG. 2 illustrates an example packaged high-power laser system 200 according to this disclosure. The packaged laser system 200 includes various optical components and generally helps to maintain optical alignment of those components. These components could include a lasing medium (such as a planar waveguide), laser diode pump arrays, injection optics, master oscillator, adaptive optics, and beam formatting and relay optics between these elements.

For high average-power laser systems, nearly all elements that are in close thermal proximity to a signal beamline and certain elements that may catch stray pumplight need to be actively cooled, and a cooling manifold is used to distribute coolant and maintain proper mass flow rates and hydraulic pressures. Conventional wisdom in high-power laser systems is to segregate the alignment function (associated with an optical bench) and the cooling function (associated with the cooling manifold). Conventional high-power laser systems therefore often thermally insulate an optical bench and critical mounting hardware attached thereto from any cooling path in order to maintain an isothermal condition within these critical components. This is because temperature variations across the optical bench caused by differences in coolant temperatures can cause the optical bench to warp and misalign the optical components.

This approach is used in some conventional PWG lasers, where the optical bench is separate from the cooling system. The optical bench is thermally insulated from any component that would cause heating due to (i) direct irradiance by a signal beam from a laser, (ii) direct irradiance by pumplight from pump arrays, (iii) indirect irradiance from scattered light, and (iv) heat conduction through mounts and other components. The optical bench is kinematically mounted so that thermal deformation of the housing to which the optical bench is mounted would not cause misalignment. At low average powers, this approach is effective and does not penalize the system severely due to size and weight impacts. However, at higher average powers, the added size and weight associated with physically- and functionally-independent optical bench hardware and cooling manifold hardware severely impact the desirability of these lasers for many applications.

These prior approaches present various problems in achieving a compact high-power laser design. For example, the size and weight associated with a separate thermally-isolated optical bench grow substantially as the laser power increases. Also, critical alignment features (such as optics and mounts) and the optical bench itself are subject to stray pumplight irradiance and, without active cooling, would warp anyway. While light baffling can mitigate some of these problems, components are often in such close proximity that it is impractical to rely on baffling alone.

In addition, as solid-state lasers are scaled to higher average output powers, the problems associated with stress-free mounting of the lasing medium, uniform cooling of the lasing medium, efficient coupling of pumplight into the lasing medium, and efficient coupling of laser beams into and out of the lasing medium are exacerbated. Stressful mounting and non-uniform heating can create phase distortions in amplified beams and can lead to damage or fracture of the lasing medium and nearby elements. Inefficient coupling of pumplight into the lasing medium can lead to overall laser inefficiencies, and stray light can cause damage to the lasing medium and other structures. Similarly, stray laser beams can cause damage, and the loss of power in the stray laser beams detracts from the output power and overall laser efficiency. As laser powers increase, it becomes more and more important to include diagnostic elements in a laser system, such as to determine root causes for problems and failures and to facilitate design improvements.

The packaged high-power laser system 200 of FIG. 2 incorporates a dual-function optical bench and cooling manifold for use with a PWG MOPA laser system. As shown in FIG. 2, the packaged laser system 200 includes input optics 202, which format the low-power signal beam from the master oscillator 102 for optimal coupling into the PWG amplifier 104. In some embodiments, the formatted signal beam is coupled into the core region of the PWG amplifier 104 via a front-surface reflective optic as described below. In other embodiments, an internal reflection prism or other suitable optical elements may be used for this purpose. The low-power signal beam from the master oscillator 102 can be routed using various lenses, mirrors, or other optical elements along one or more optical paths. The input optics 202 include any suitable optical device(s) for formatting a low-power signal beam. The input optics 202 could, for example, represent part or all of the relay optics 110 of FIG. 1.

A PWG pumphead housing 204 and a PWG cartridge 206 (with its cover removed in FIG. 2), together with one or more laser diode pump arrays 208, pump coupling optics 210, and a light pipe 212, implement the PWG amplifier 104. The PWG pumphead housing 204 generally encases, protects, or otherwise contains certain elements of the PWG amplifier 104 associated with the lasing medium. The PWG pumphead housing 204 can be coupled to other components of the packaged high-power laser system 200 to help maintain optical alignment of various components in the laser system. The PWG pumphead housing 204 could be formed from any suitable material(s) and in any suitable manner.

The PWG cartridge 206 includes the lasing medium of the PWG amplifier 104, meaning the PWG cartridge 206 includes the core region and the cladding layer(s) of a planar waveguide. The PWG cartridge 206 could also include other features, such as one or more high-efficiency liquid jet impingement coolers, liquid microchannel coolers, or other cooling mechanisms. The PWG cartridge 206 includes any suitable structure(s) containing a planar waveguide. In some embodiments, the PWG cartridge 206 is removable from the PWG pumphead housing 204, allowing different planar waveguides and cooling mechanisms to be easily implemented within the same PWG pumphead housing 204.

Pumplight is generated for delivering pump power into the planar waveguide by the one or more laser diode pump arrays 208. The pumplight from the laser diode pump arrays 208 is coupled into the planar waveguide of the PWM amplifier 104 in order to provide the population inversion needed for optical amplification in the lasing medium. Each laser diode pump array 208 includes any number of laser diodes or other light sources in any suitable arrangement. While two laser diode pump arrays 208 are shown here, the packaged laser system 200 could include any number of laser diode pump arrays 208.

The pumplight from the laser diode pump arrays 208 is formatted for coupling into the planar waveguide by the coupling optics 210. The pumplight is then coupled into the core region and/or the cladding layer(s) of the planar waveguide using the light pipe 212. The coupling optics 210 include any suitable optical device(s) for directing or formatting optical signals. The light pipe 212 includes any suitable optical device for confining, homogenizing, and/or transporting optical signals.

During operation of the laser system 100, the low-power signal beam from the master oscillator 102 is amplified as it propagates through the PWG amplifier 104 based on power received from the laser diode pump arrays 208. The low-power signal beam from the master oscillator 102 is guided only in the thin dimension or fast axis of the PWG amplifier 104.

Output fold optics 213 and output optics 214 collimate and reformat the high-power beam generated by the PWG amplifier 104. In this example, the output fold optics 213 reverse the direction of the high-power beam, and the output optics 214 reformat the high-power beam. The output optics 214 could also provide samples of the high-power beam to a diagnostics module 216. The output fold optics 213 include any suitable optical device(s) for redirecting a high-power signal beam. The output optics 214 include any suitable optical device(s) for directing or formatting a high-power signal beam. The output fold optics 213 and the output optics 214 could, for example, represent part or all of the beam splitter 112 and the relay optics 114 of FIG. 1.

The diagnostics module 216 implements the diagnostics unit 118 of FIG. 1 and measures one or more properties of the high-power output beam. For example, the diagnostics module 216 could generate wavefront error and/or power-in-the-bucket beam quality measurements using samples of the high-power output beam. The diagnostics module 216 includes any suitable structure(s) for identifying and/or measuring one or more characteristics of a high-power output beam.

A baseplate 218 is used to support various components of the packaged high-power laser system 200. For example, various components could be attached to the baseplate 218 to hold the components in place within the laser system 200. The baseplate 218 could represent a portion of an optical bench, which is described more fully below. The baseplate 218 could be formed from any suitable material(s) and in any suitable manner.

Although FIG. 2 illustrates one example of a packaged high-power laser system 200, various changes may be made to FIG. 2. For example, the sizes, shapes, and relative dimensions of the various components in FIG. 2 are for illustration only. Also, the specific arrangement of components in FIG. 2 could vary as needed or desired.

Figure 3:
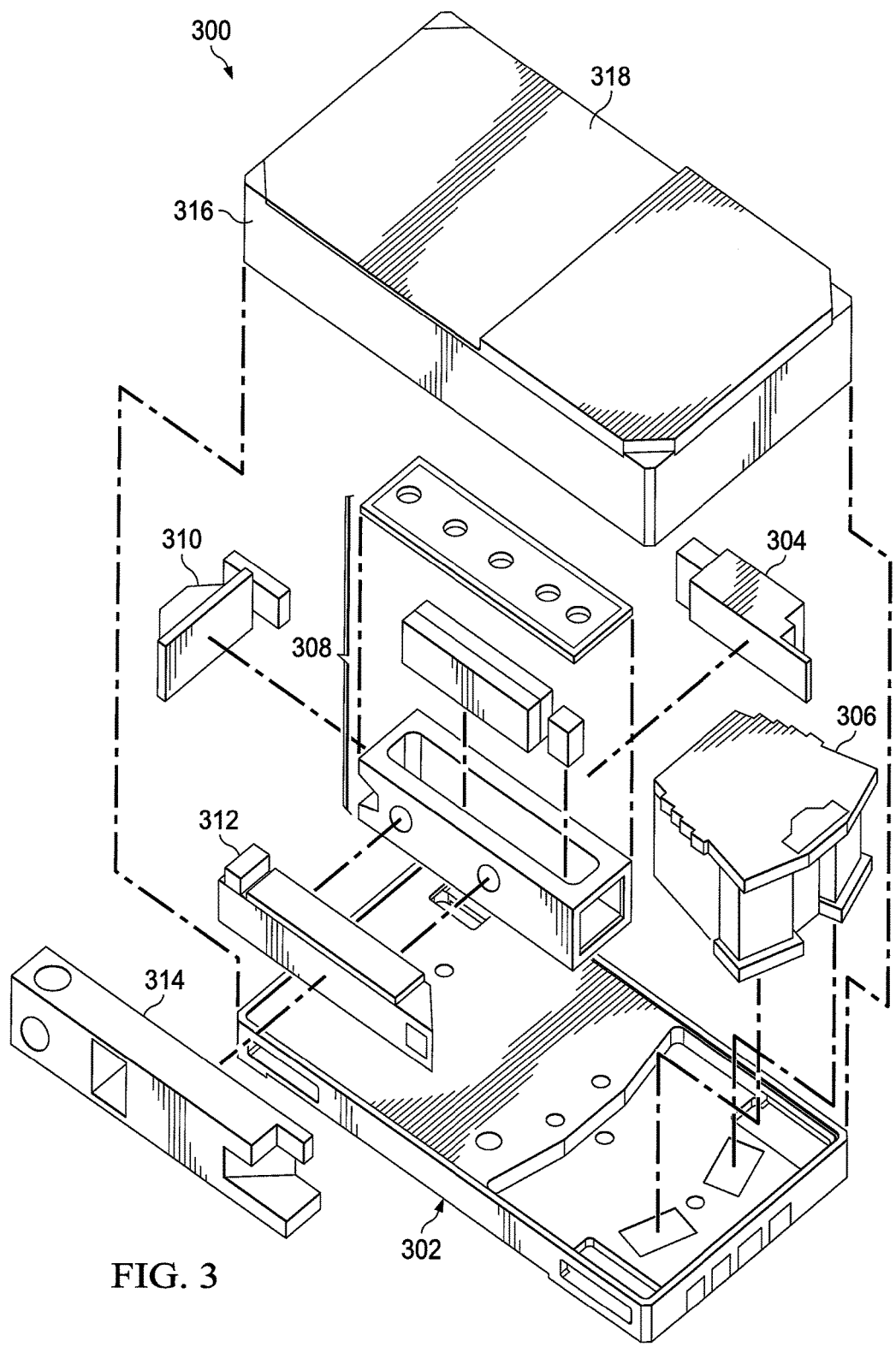
FIGS. 3 through 6 illustrate an example integrated optical bench and cooling manifold in a packaged high-power laser system according to this disclosure.

FIGS. 3 through 6 illustrate an example integrated optical bench and cooling manifold in a packaged high-power laser system 200 according to this disclosure. In particular, FIG. 3 shows an exploded isometric view 300 of the packaged laser system 200 with its mounting features. As shown in FIG. 3, the laser system 200 includes an optical bench and cooling manifold 302 on which other components of the laser system 200 can be mounted and through which coolant can flow to cool components of the laser system during operation. The optical bench and cooling manifold 302 could be formed from any suitable material(s) and in any suitable manner.

The remaining components of the packaged high-power laser system 200 can be implemented in a modular fashion (although this need not be the case). An input optics assembly 304 includes the input optics 202, and a pump optics assembly 306 includes the laser diode pump arrays 208 and the coupling optics 210. A PWG pumphead assembly 308 includes the PWG pumphead housing 204, the PWG cartridge 206, and the light pipe 212. An output fold assembly 310 includes the output fold optics 213, an output collimator assembly 312 includes the output optics 214, and a diagnostics assembly 314 includes the diagnostics module 216. Each of these assemblies could be designed and fabricated separately, and multiple versions of each assembly could be available for combination into a single laser system 200.

An enclosure 316 and a lid 318 can be placed over the various components of the laser system 200. The enclosure 316 includes input and output windows, beam dumps, coolant paths, and other components as described in more detail below. The enclosure 316 could be formed from any suitable material(s) and in any suitable manner. The lid 318 is placed over the enclosure 316 and can be sealed or otherwise secured to the enclosure 316. This allows various components of the packaged laser system 200 to be encased within a space defined by the optical bench and cooling manifold 302, the enclosure 316, and the lid 318. The lid 318 could be formed from any suitable material(s) and in any suitable manner.

The design shown in FIG. 3 need not be an isothermal design. Rather, the design of the packaged laser system 200 can thermally balance the packaged laser system 200 in order to reduce or minimize misalignment of critical optical components along critical alignment axes. Thermal stresses arising from a normal drop in coolant temperature as the coolant flows through the packaged laser system 200 can be balanced to maintain linear and angular alignment between critical elements along critical axes. Motion of non-critical elements, such as baffles and absorbers, and relative motion between critical elements along non-critical axes need not be controlled and are allowed in order to facilitate thermal expansion, contraction, and deformation of the overall structure. In some embodiments, the design for a specific implementation can be created based on computer finite element modeling and appropriate selection of materials, and kinematic techniques for mounting can be employed to maintain alignment along critical axes. As noted earlier, various assemblies shown in FIG. 3 can be secured to the PWG pumphead assembly 308 to help maintain alignment of optical components.

Figure 4:
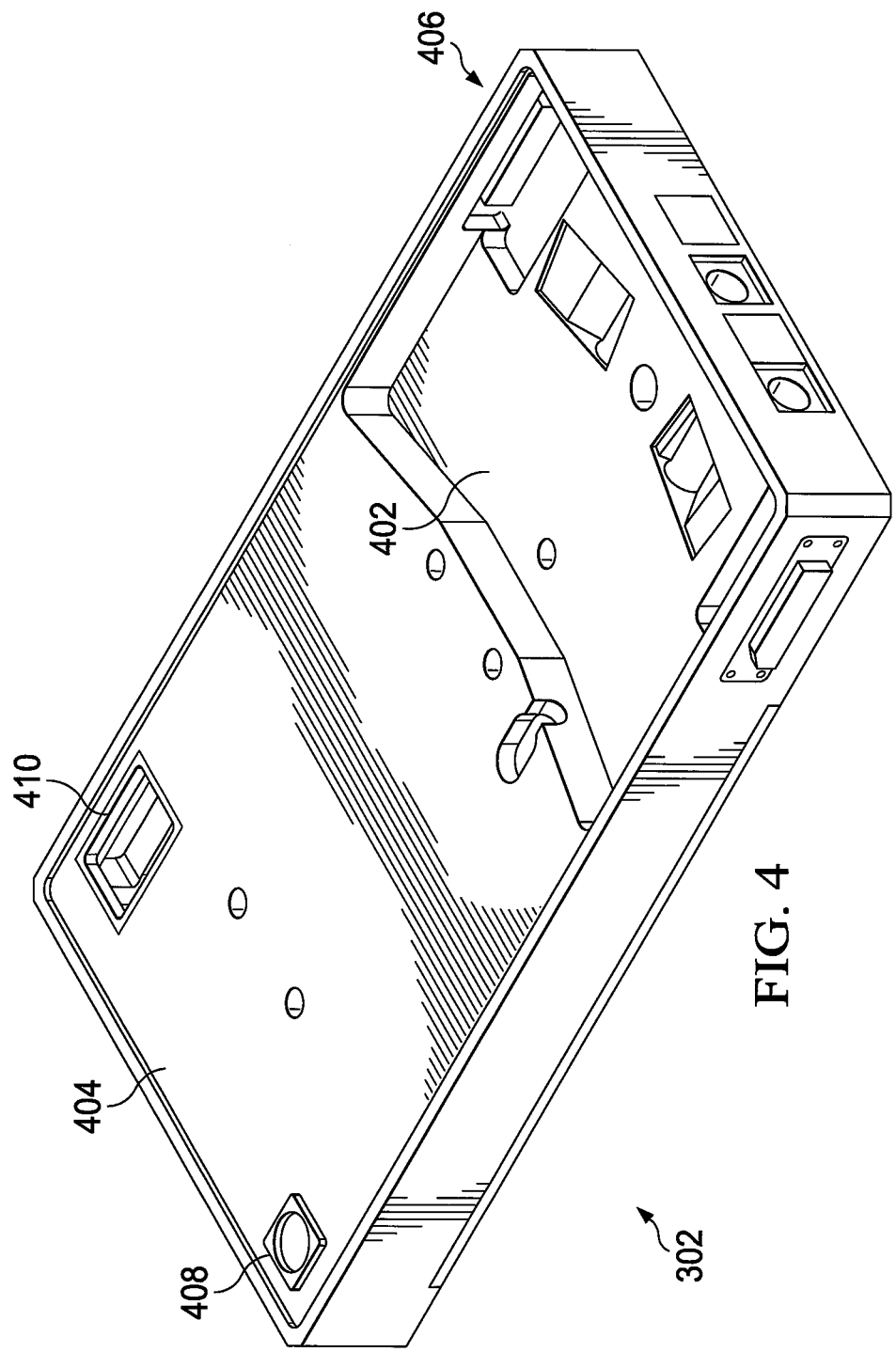

FIG. 4 shows a top view of the optical bench and cooling manifold 302 in greater detail. As shown in FIG. 4, the optical bench and cooling manifold 302 includes a laser diode pump array mount 402 and a PWG pumphead housing mount 404. The laser diode pump array mount 402 denotes a location where the pump optics assembly 306 can be mounted on the optical bench and cooling manifold 302. Similarly, the PWG pumphead housing mount 404 denotes a location where the PWG pumphead assembly 308 can be mounted on the optical bench and cooling manifold 302. Each mount 402-404 includes holes or other mechanisms facilitating attachment to the respective assembly 306-308, as well as holes acting as passageways for coolant. Each mount 402-404 could have any suitable size, shape, and dimensions based on the design of the respective assembly 306-308. In this example, the laser diode pump array mount 402 is recessed while the PWG pumphead housing mount 404 is not, although other designs could be used.

The optical bench and cooling manifold 302 also includes one or more diode array connectors 406. The diode array connectors 406 allow control signals, power, or other signals to be provided to or received from the pump optics assembly 306. For example, the diode array connectors 406 could couple the laser diode pump arrays 208 to the diode driver 124, which allows the laser diode pump arrays 208 to be controlled in order to control the pump power provided into the PWG amplifier 104. Each diode array connector 406 includes any suitable structure(s) for transporting signals to or from one or more laser diode pump arrays. While there are two diode array connectors 406 shown on opposite sides of the optical bench and cooling manifold 302 in FIG. 4, the optical bench and cooling manifold 302 could include any number of diode array connectors 406 in any suitable arrangement.

At least one beam dump window 408 allows residual laser power to be diverted out of the packaged high-power laser system 200. For example, the beam dump window 408 could be used in conjunction with an optical switch to provide a safety feature that quickly and safely blocks the output beam 116. The beam dump window 408 can also allow unwanted optical power to escape the optical bench and cooling manifold 302, such as stray beams from the laser diode pump arrays 208 that do not couple into the PWG amplifier 104. Each beam dump window 408 includes any suitable structure(s) for allowing passage of optical power, such as a window that is substantially optically transparent to the optical power. While a single beam dump window 408 is shown here, multiple beam dump windows could be used as described below.

A bulkhead mount 410 for a sensor connector allows at least one sensor to be coupled to the optical bench and cooling manifold 302. For example, the bulkhead mount 410 could allow at least one temperature sensor to be coupled directly to the optical bench and cooling manifold 302. The temperature sensor can be used to measure the temperature of the optical bench and cooling manifold 302 during operation and to detect unsafe or hazardous conditions associated with the packaged high-power laser system 200. The bulkhead mount 410 could have any suitable size, shape, and dimensions depending on the sensor(s) being used. While a single bulkhead mount 410 is shown here, multiple bulkhead mounts could be used.

Note that the diode array connectors 406 and the beam dump windows 408 can be sealed to prevent material from leaking out of or into the packaged laser system 200. A seal can also be used with the bulkhead mount 410 after one or more sensors are inserted into the bulkhead mount 410.

Figure 5:
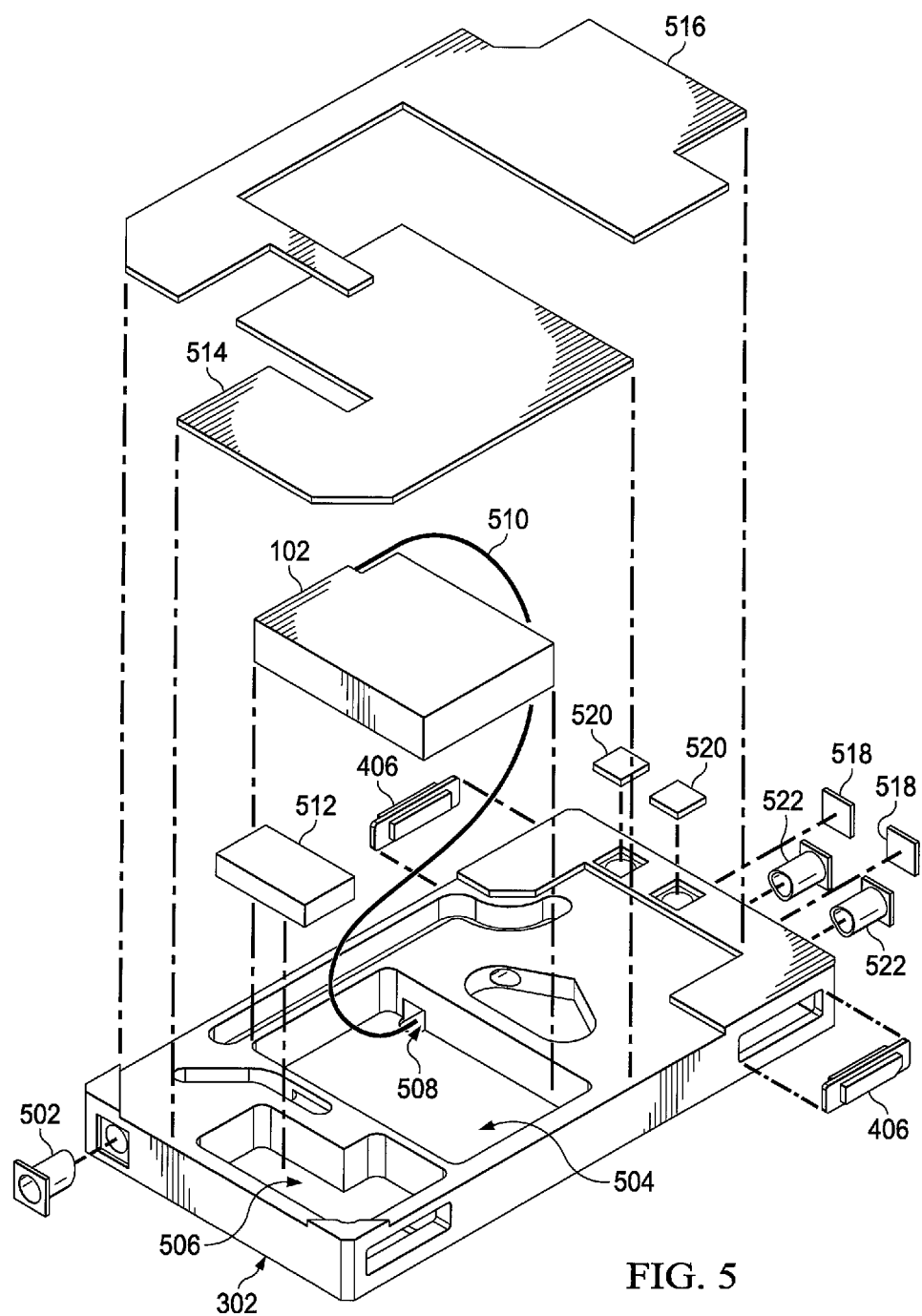
Figure 6:
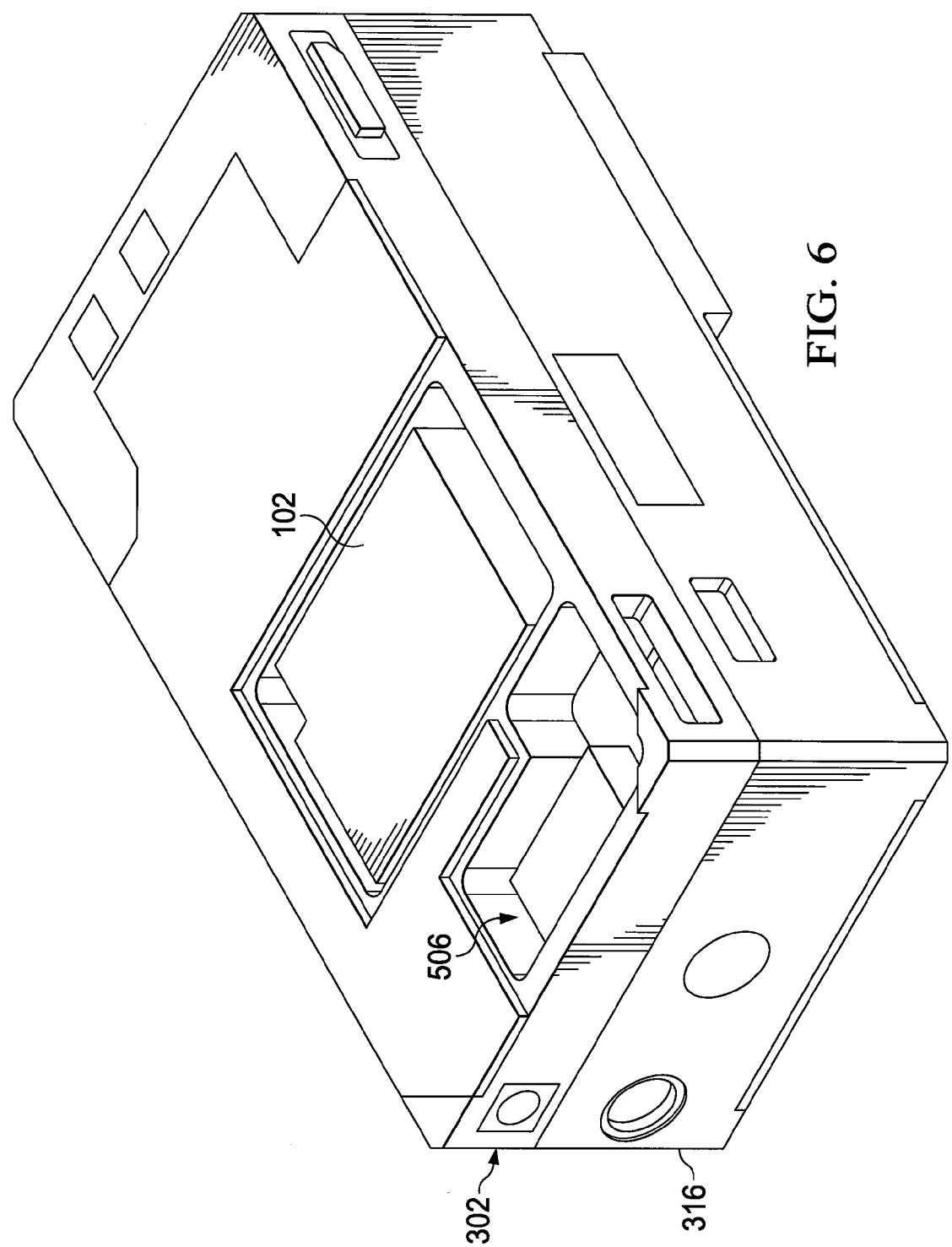

FIGS. 5 and 6 show a bottom view of the optical bench and cooling manifold 302 in greater detail. In particular, FIG. 5 shows an exploded bottom view including the optical bench and cooling manifold 302, while FIG. 6 shows an assembled bottom view including the optical bench and cooling manifold 302.

As shown in FIGS. 5 and 6, the diode array connectors 406 can be inserted into the sides of the optical bench and cooling manifold 302. Also, a beam dump mirror 502 can be inserted into the optical bench and cooling manifold 302 and used to direct optical power through the beam dump window 408. The beam dump mirror 502 includes any suitable optical device for reflecting optical power through a beam dump window.

A master oscillator cavity 504 and a laser electronics cavity 506 are formed in the optical bench and cooling manifold 302. The cavity 504 is used to hold the master oscillator 102. The master oscillator cavity 504 includes a passageway 508 for a connection 510 to the master oscillator 102, such as a fiber optic connection to the master oscillator 102. The connection 510 could couple the output of the master oscillator 102 to the input of the input optics 202. The master oscillator 102 can be pinned or bolted on multiple pads to maintain optical data reference, although this may be unnecessary with a fiber optic connection. The cavity 506 is used to hold various electronics used by the laser system 200, such as control circuitry for controlling the overall operation of the laser system 200 (like the laser controller 120). Each cavity 504-506 could have any suitable size, shape, and dimensions. In this example, each cavity 504-506 is recessed, although other designs could be used.

Sensor electronics 512 can be used in conjunction with laser electronics inserted into the cavity 506. For example, the sensor electronics 512 could include one or more analog-to-digital converters for converting analog temperature or other measurements into digital signals. The sensor electronics 512 could also include filters, amplifiers, or other components for pre-processing sensor measurements. The sensor electronics 512 include any suitable structure(s) for processing or handling sensor measurements.

A first cover 514 and a second cover 516 are used to help protect other components of the laser system 200. For example, the first cover 514 could be used to cover the master oscillator 102 inserted into the cavity 504 and the laser electronics inserted into the cavity 506. As a particular example, the first cover 514 could represent a hermetic seal that helps to prevent contamination of high irradiance optical surfaces from outgassing of the laser electronics, thereby avoiding damage to the optical assemblies and their associated coatings. The second cover 516 could be used as a waterproof shield to help prevent water or other fluids from infiltrating the optical compartments of the laser system 200 and causing damage. Each cover 514-516 could be made of any suitable material(s) and in any suitable manner.

First coolant port covers 518, second coolant port covers 520, and flow diverters/sealing plates 522 are used to control the flow of coolant through the optical bench and cooling manifold 302. As described in more detail below, the port covers 518-520 and flow diverters/sealing plates 522 can be used to allow coolant to enter or exit and flow through the optical bench and cooling manifold 302 in different ways as needed for particular implementations of the packaged high-power laser system 200. Each port cover 518-520 includes any suitable structure for blocking an inlet or outlet port for coolant. Each flow diverter/sealing plate 522 includes any suitable structure for diverting a flow of coolant and blocking an inlet or outlet port for the coolant.

Figure 7A:
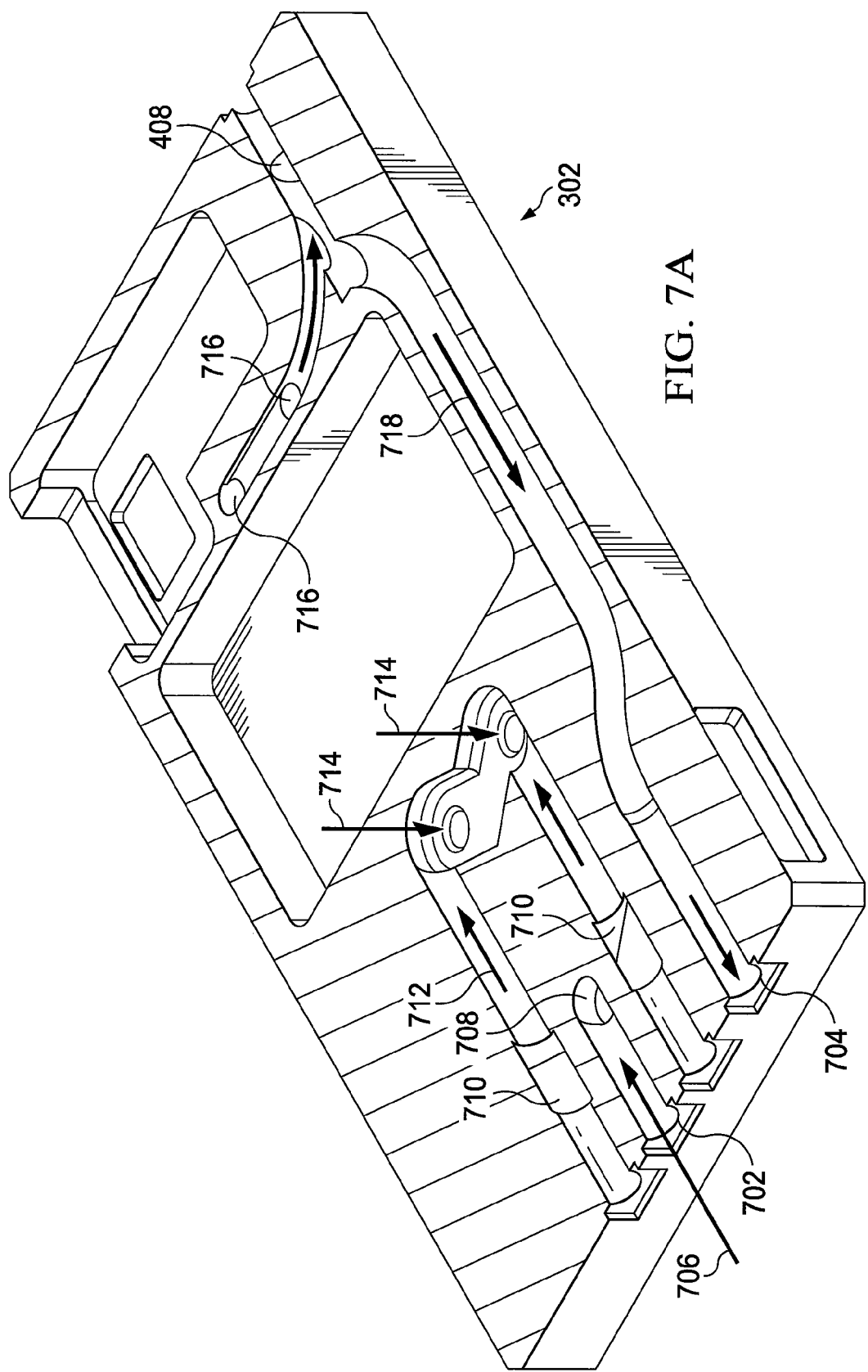
FIGS. 7A and 7B illustrate example coolant flow in an optical bench and cooling manifold of a packaged high-power laser system according to this disclosure.
Figure 7B:
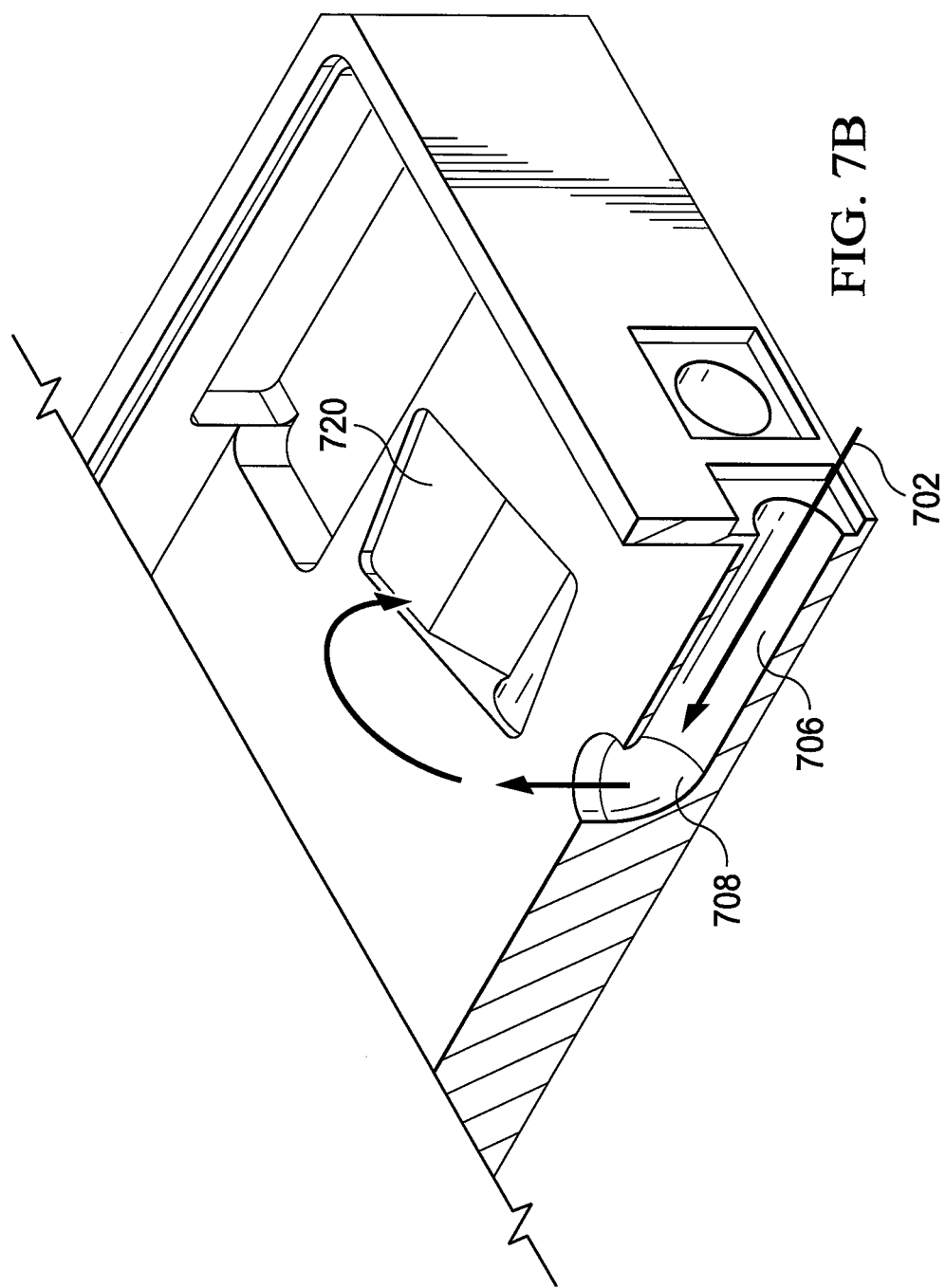

FIGS. 7A and 7B illustrate example coolant flow in an optical bench and cooling manifold 302 of a packaged high-power laser system 200 according to this disclosure. The cooling paths in this particular implementation are formed when the first coolant port covers 518 are not attached to the optical bench and cooling manifold 302, revealing a coolant inlet 702 and a coolant outlet 704. The second coolant port covers 520 are attached to the optical bench and cooling manifold 302, and the flow diverters/sealing plates 522 are inserted into the optical bench and cooling manifold 302.

As shown in FIG. 7A, in this configuration, coolant enters through the coolant inlet 702 and travels through a passageway 706 to a channel 708. The channel 708 provides the coolant to the pump optics assembly 306 in order to cool the laser diode pump arrays 208. After that, the coolant flows through channels 710 from the pump optics assembly 306 into passageways 712, which lead to channels 714. The channels 714 provide the coolant to the PWG pumphead housing 204 in order to cool to the PWG amplifier 104. The coolant returns from the PWG pumphead housing 204 through channels 716, where the coolant travels through a passageway 718 to the coolant outlet 704.

FIG. 7B shows a cross-section of the optical bench and cooling manifold 302 through the passageway 706 and the channel 708, which provides coolant to the laser diode pump arrays 208. The cross-section here shows how the coolant flows through one laser diode pump array 208 before returning to a conduit 720. The conduit 720 leads to one of the channels 710 on the opposite side of the optical bench and cooling manifold 302.

The various passageways shown here generally extend along a length of the optical bench and cooling manifold 302, while the various channels generally extend through the optical bench and cooling manifold 302. With the exception of the passageway 718, the channels, conduits, and passageways 704-716 are generally balanced, meaning the channels, conduits, and passageways 704-716 are substantially symmetrical about a central axis of the optical bench and cooling manifold 302.

In accordance with this design, coolant flows through the optical bench and cooling manifold 302, helping to cool the optical bench and cooling manifold 302 during operation of the laser system 100. The coolant also flows through the pump optics assembly 306 and the PWG pumphead assembly 308, helping to cool these components during operation of the laser system 100. This design accommodates downstream increases in coolant temperatures caused by heat absorption as the coolant flows through the laser system 100. Moreover, this design maintains the necessary mass flow rate and pressure for efficient cooling of critical components.

Although FIGS. 3 through 6 illustrate one example of an integrated optical bench and cooling manifold 302 in a packaged high-power laser system 200, various changes may be made to FIGS. 3 through 6. For example, the design of the optical bench and cooling manifold 302 could vary in different ways based on the design of the laser system 200. Also, the sizes, shapes, and relative dimensions of the components could vary according to particular needs. Although FIGS. 7A and 7B illustrate examples of coolant flow in an optical bench and cooling manifold 302 of a packaged high-power laser system 200, various changes may be made to FIGS. 7A and 7B. For instance, the sizes, shapes, and dimensions of the cooling channels and passageways could vary. Moreover, different flows of coolant could be used in an optical bench and cooling manifold 302 as needed or desired, such as by altering which coolant port covers and flow diverters/sealing plates are used. However, an optical bench and cooling manifold 302 could include only non-reconfigurable coolant flows, and the coolant port covers and flow diverters/sealing plates could be omitted.

Figure 8A:
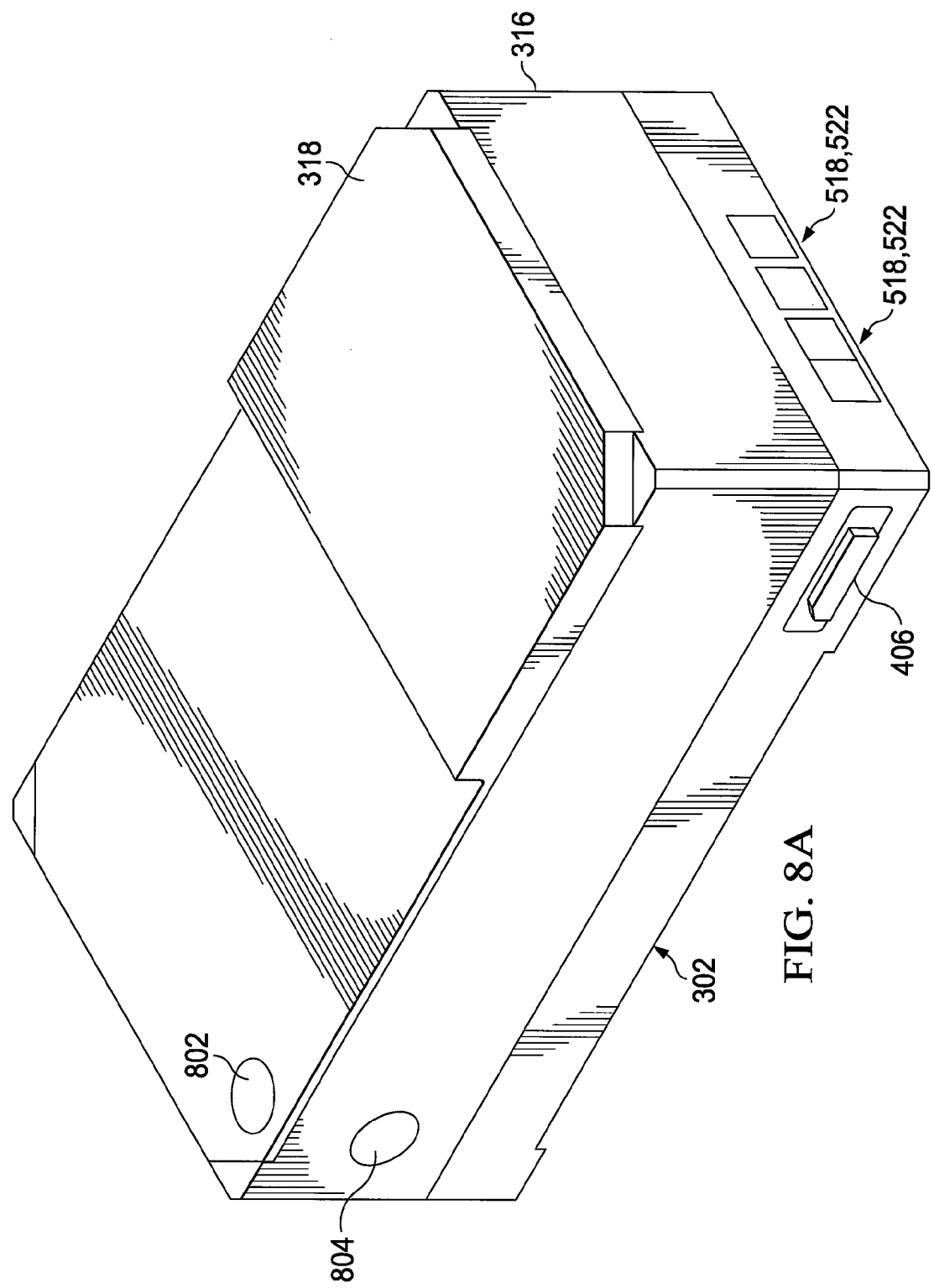
FIGS. 8A through 8C and FIG. 9 illustrate additional details of an example packaged high-power laser system according to this disclosure.
Figure 8B:
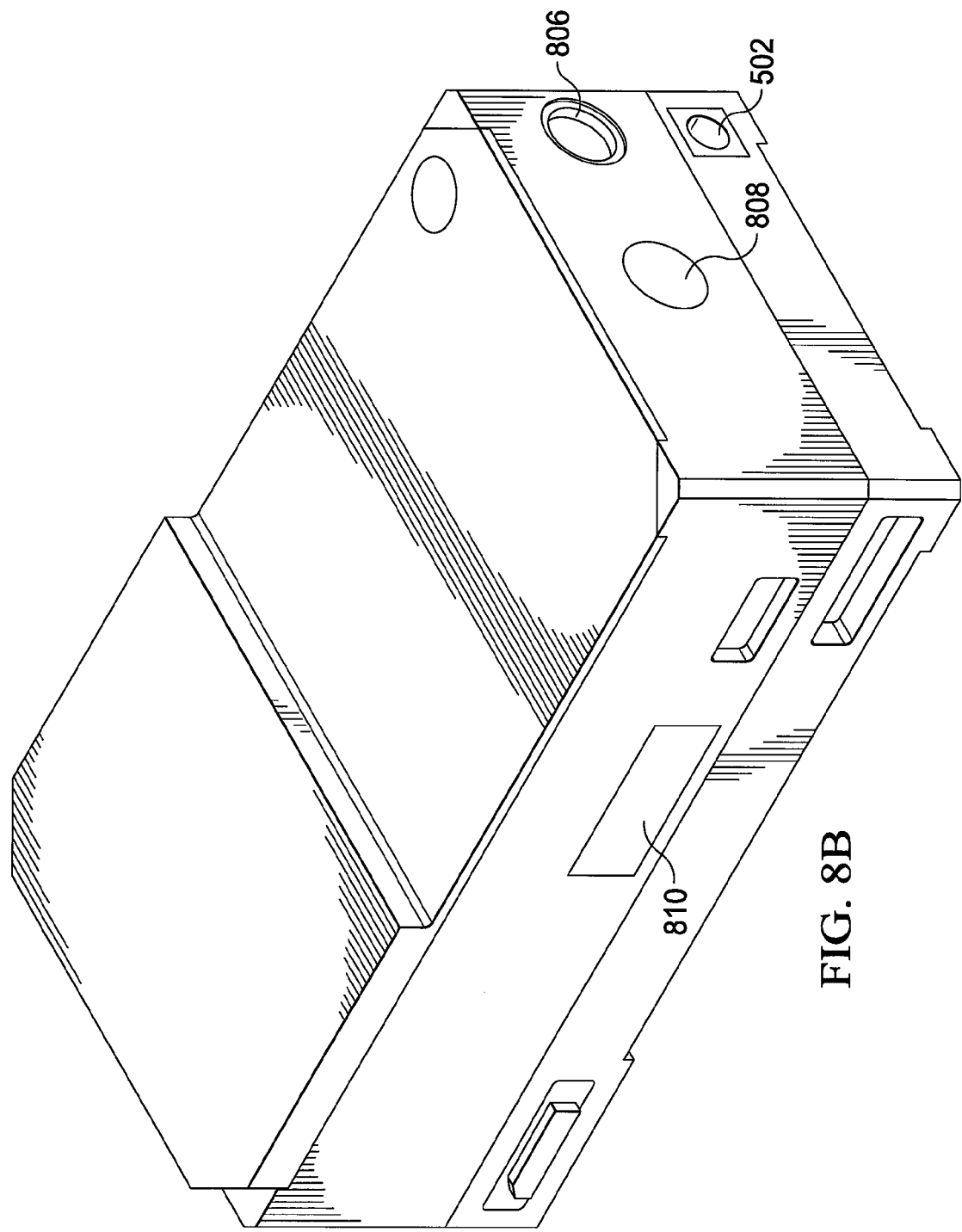
Figure 8C:
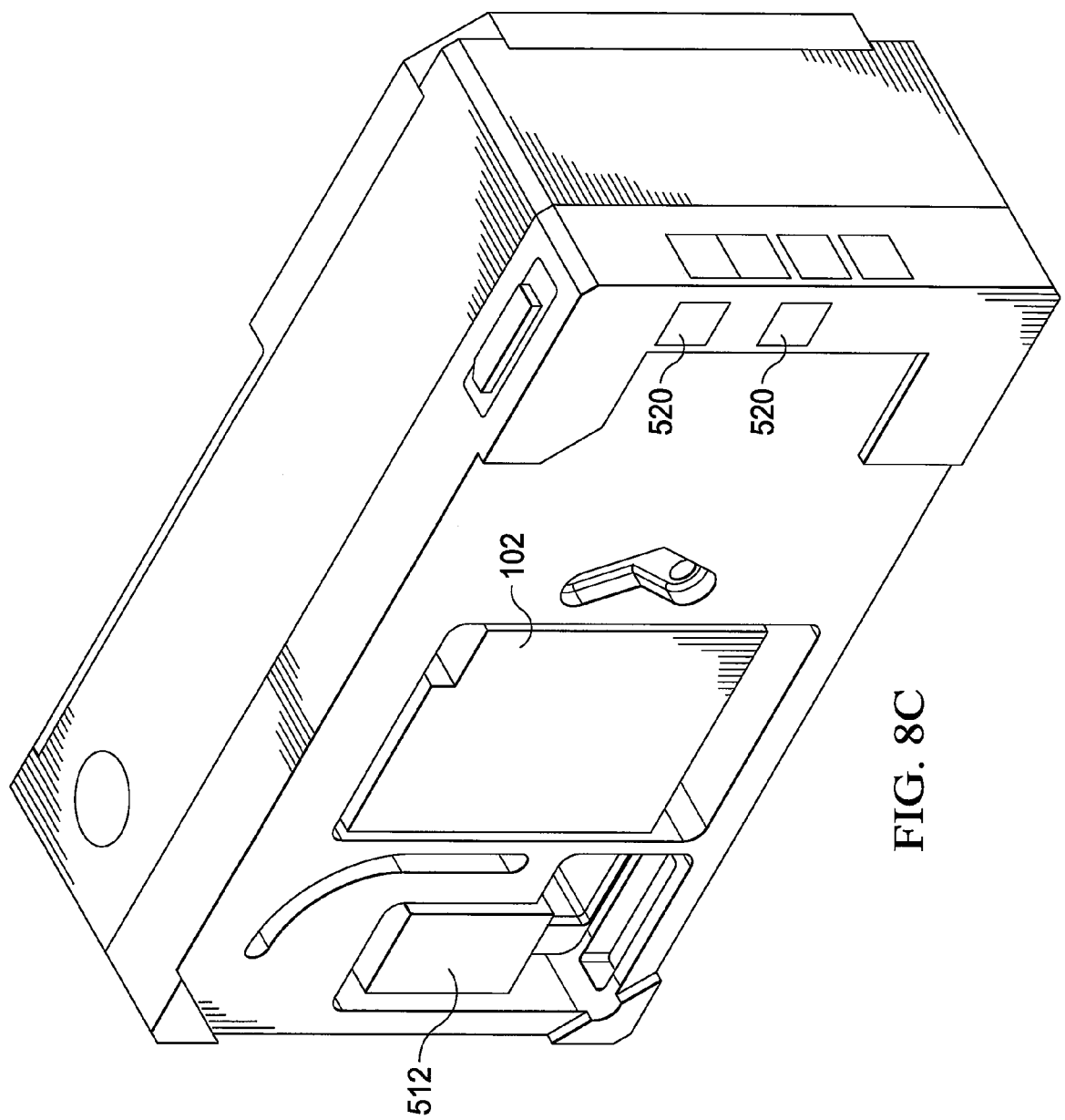

FIGS. 8A through 8C and FIG. 9 illustrate additional details of an example packaged high-power laser system 200 according to this disclosure. As shown in FIGS. 8A through 8C, the packaged laser system 200 includes the optical bench and cooling manifold 302 with all of the associated mounted components, the enclosure 316, and the lid 318. The lid 318 and the enclosure 316 include various beam exit apertures 802-806. The beam exit apertures 802-806 denote locations where the high-power output beam 116 can exit the packaged laser system 200. Different beam exit apertures 802-806 can be provided at different locations of the packaged laser system 200 in order to allow different usages of the packaged laser system 200. Each beam exit aperture 802-806 denotes any suitable structure allowing passage of a high-power output beam.

At least one diagnostic viewing port 808 is provided in the packaged high-power laser system 200. The diagnostic viewing port 808 allows an operator or other personnel to view into the interior of the packaged laser system 200. This may allow, for example, the personnel to manually verify operation of the packaged laser system 200. The diagnostic viewing port 808 could also pass infrared (IR) radiation, allowing functions such as spatial and temperature high-resolution IR thermography used to detect hot spots and other deleterious thermal effects before component damage occurs. Each diagnostic viewing port 808 includes any suitable structure allowing viewing into a packaged laser system.

In addition, an input optics access cover 810 is provided in the packaged laser system 200. The input optics access cover 810 provides access to the input optics 202 of the input optics assembly 304. The input optics access cover 810 could be formed from any suitable material(s) and in any suitable manner.

Figure 9:
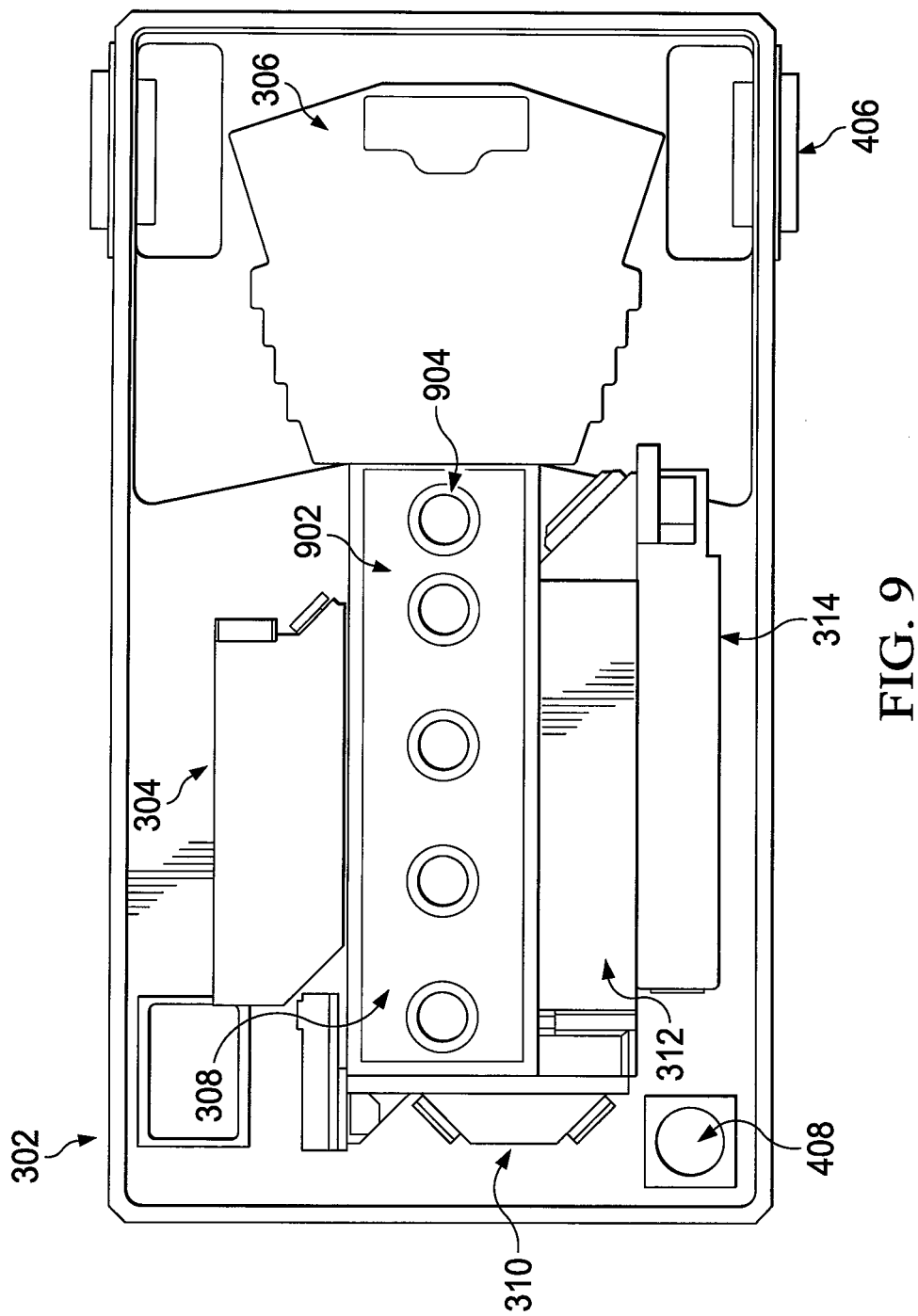

In FIG. 9, the PWG pumphead assembly 308 includes a cover 902 forming part of the PWG pumphead housing 204, where the cover 902 includes multiple viewing ports 904. The viewing ports 904 provide a way for observing various laser elements including the PWG device itself while in operation. The viewing ports 904 could also pass IR radiation, allowing functions such as spatial and temperature high-resolution IR thermography used to detect hot spots and other deleterious thermal effects before component damage occurs.

The cover 902 could be formed from any suitable material(s) and in any suitable manner. The cover 902 could also have any suitable size, shape, and dimensions. Each of the viewing ports 904 includes any suitable structure allowing passage of visible, infrared, or other radiation. At least one of the viewing ports 904 can be located to provide a view of at least one of the ends of a planar waveguide in the PWG amplifier 104. While five viewing ports 904 are shown here, the cover 902 could include any number of viewing ports.

Although FIGS. 8A through 8C and FIG. 9 illustrate additional details of one example of a packaged high-power laser system 200, various changes may be made to FIGS. 8A through 8C and FIG. 9. For example, a high-power laser system could be packaged in any other suitable manner. Also, the sizes, shapes, and relative dimensions of the various components in FIGS. 8A through 8C and FIG. 9 are for illustration only. In addition, the specific arrangements of components in FIGS. 8A through 8C and FIG. 9 could vary as needed or desired.

Figure 10A:
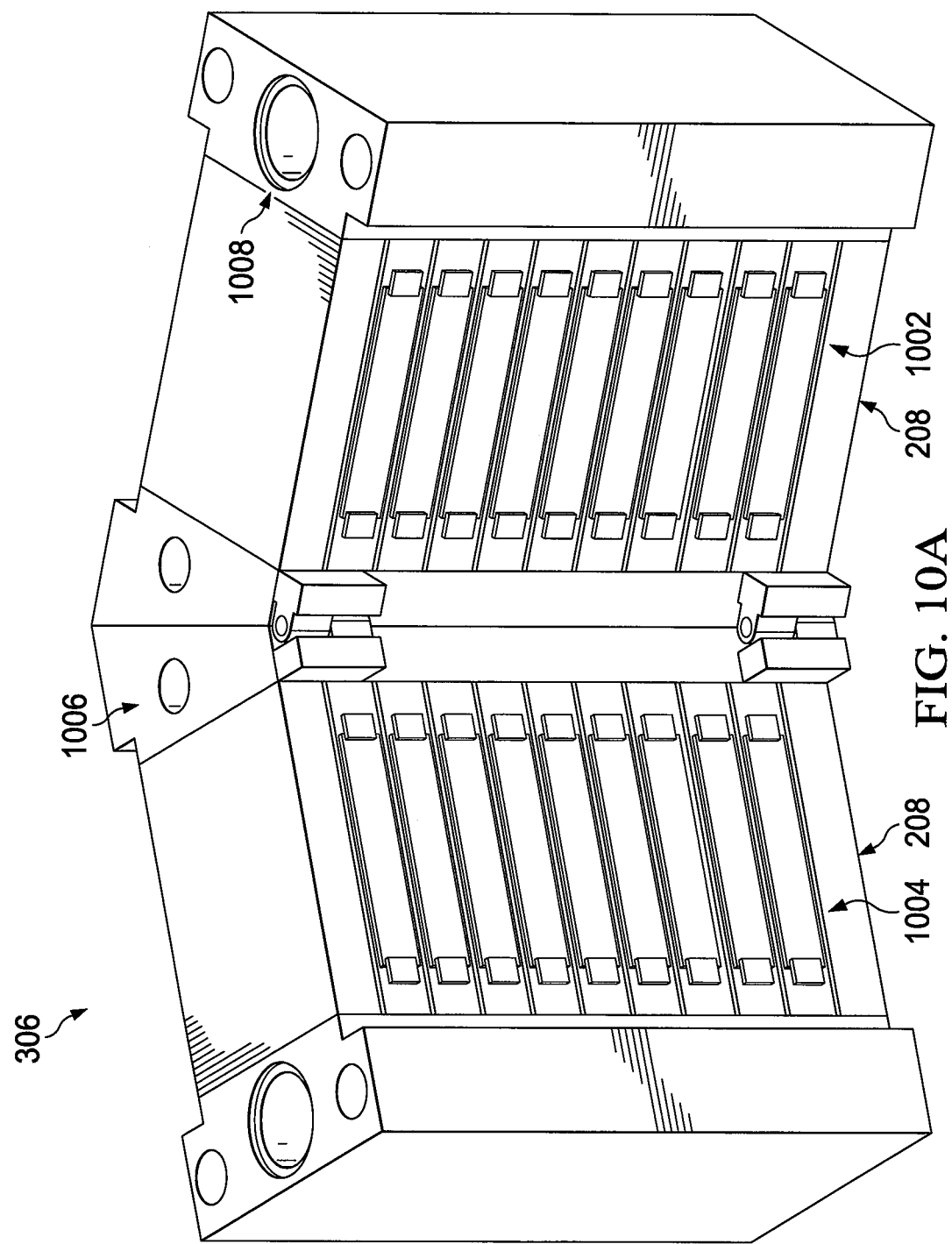
FIGS. 10A through 10C illustrate an example pump optics assembly of a packaged high-power laser system according to this disclosure.
Figure 10C:
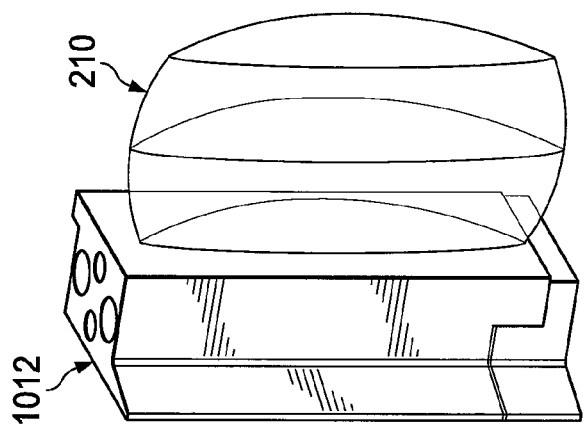
Figure 10B:
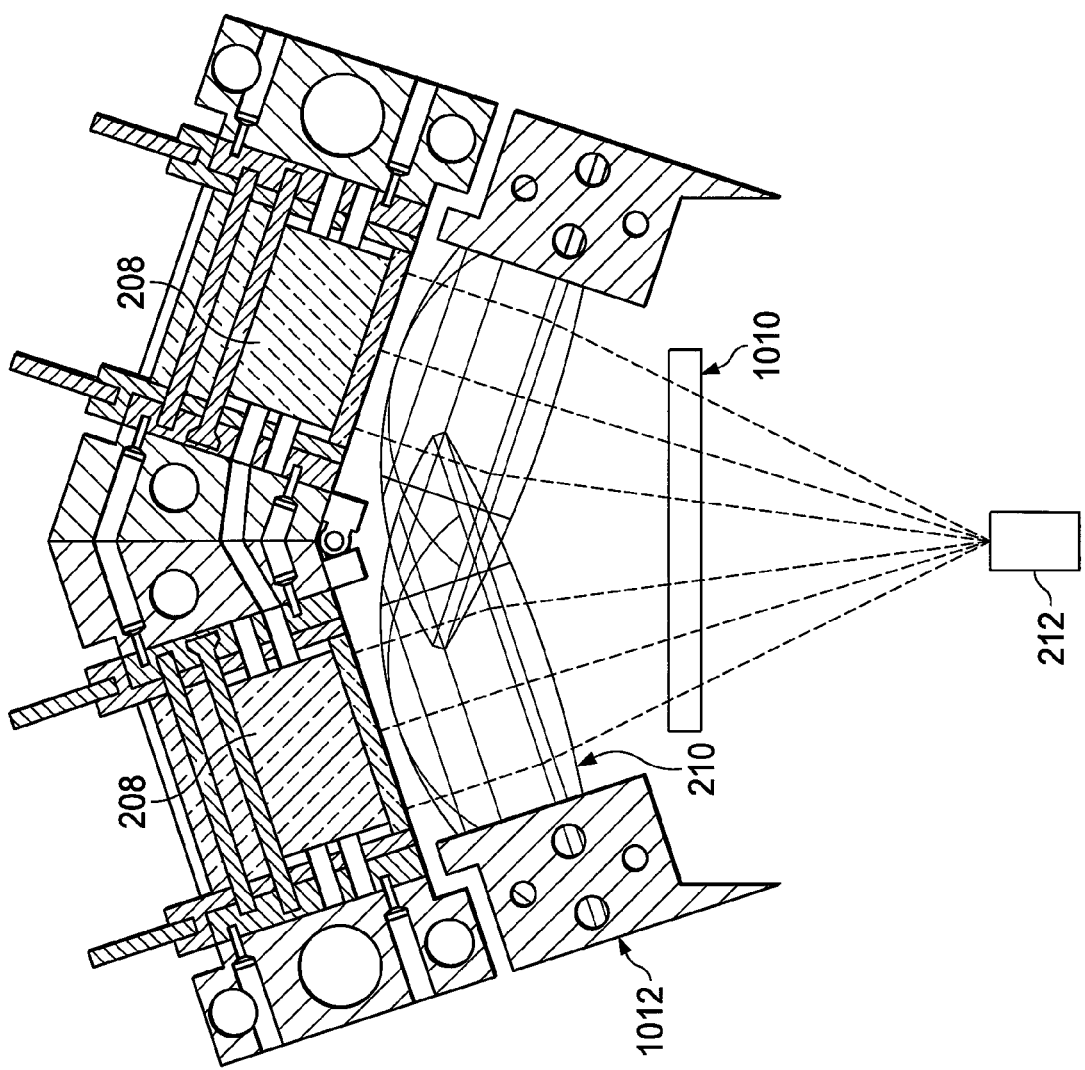

FIGS. 10A through 10C illustrate an example pump optics assembly 306 of a packaged high-power laser system 200 according to this disclosure. As noted above, the pump optics assembly 306 includes one or more laser diode pump arrays 208. In this example, the pump optics assembly 306 includes two laser diode pump arrays 208, although a single laser diode pump array 208 or more than two laser diode pump arrays 208 could be used.

Each laser diode pump array 208 includes an array of multiple laser diodes 1002, where the laser diodes 1002 are stacked and retained using a housing 1004. Any number of laser diodes 1002 could be used in each laser diode pump array 208. The housing 1004 could be formed from any suitable material(s) and in any suitable manner. The housing 1004 here includes various channels 1006-1008 that support coolant flow through the pump optics assembly 306. These channels 1006-1008 could, for instance, align with the channel 708 and conduits 720 described above.

Light from the pump optics assembly 306 can be collimated, such as by using one or more arrays of cylindrical lenslets (not shown) in close proximity to the laser diodes 1002. The collimated pumplight is focused by the coupling optics 210 through one or more windows 1010 of the PWG pumphead housing 204 and into the light pipe 212. The light pipe 212 homogenizes and couples the focused pumplight into the core region and/or the cladding layer(s) of the PWG amplifier 104. In some embodiments, two sets of laser pump diode arrays 208 and coupling optics 210 are used to pump the PWG symmetrically from both sides of the core region, although other approaches could be used. Two supports 1012 are shown here as supporting the coupling optics 210. Each support 1012 could be formed from any suitable material(s) and in any suitable manner.

Although FIGS. 10A through 10C illustrate one example of a pump optics assembly 306 of a packaged high-power laser system 200, various changes may be made to FIGS. 10A through 10C. For example, the sizes, shapes, and relative dimensions of the various components in FIGS. 10A through 10C are for illustration only. Also, the specific arrangement of components in FIGS. 10A through 10C could vary as needed or desired.

Figure 11A:
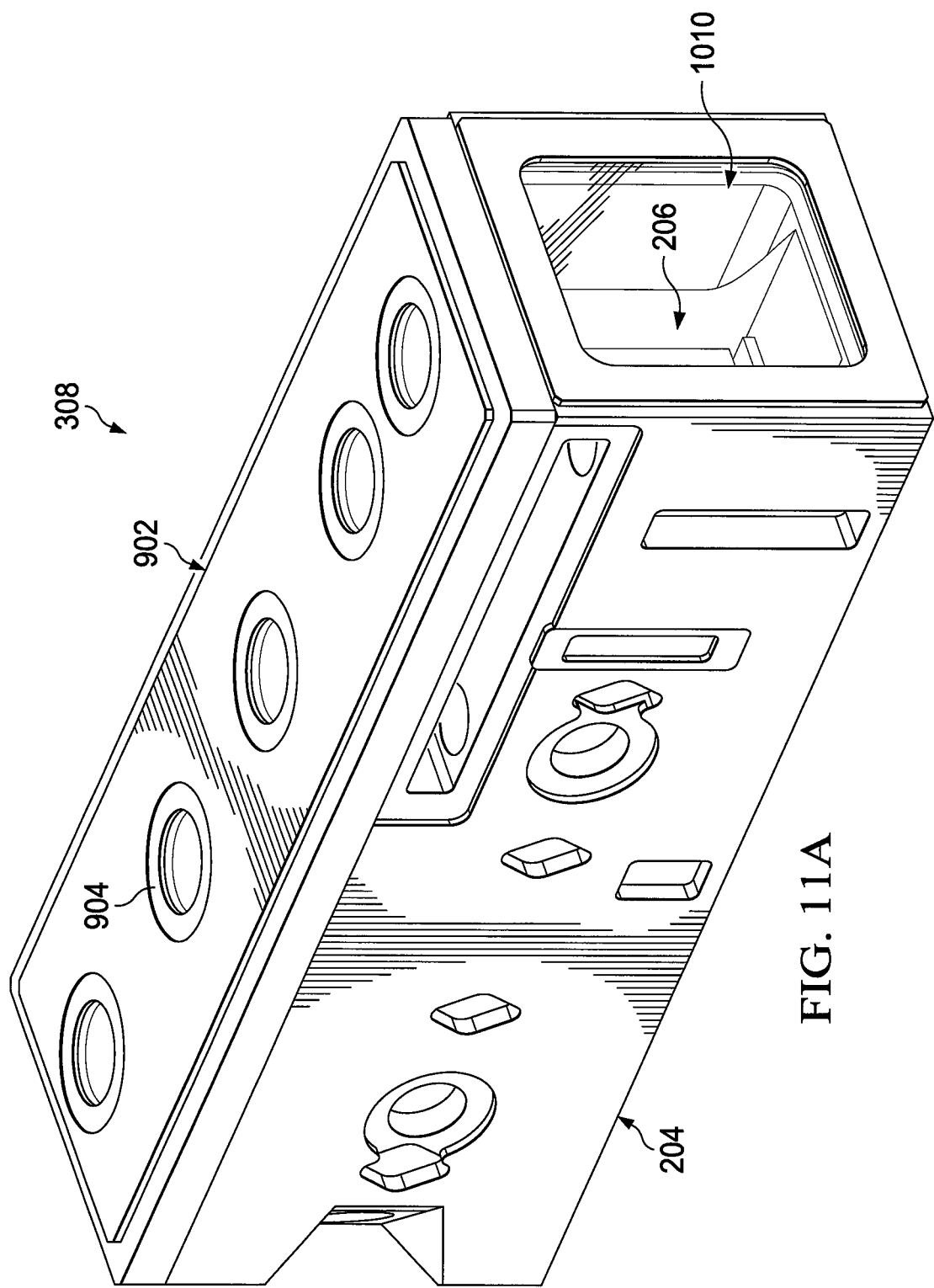
FIGS. 11A and 11B illustrate an example planar waveguide (PWG) pumphead assembly of a packaged high-power laser system according to this disclosure.
Figure 11B:
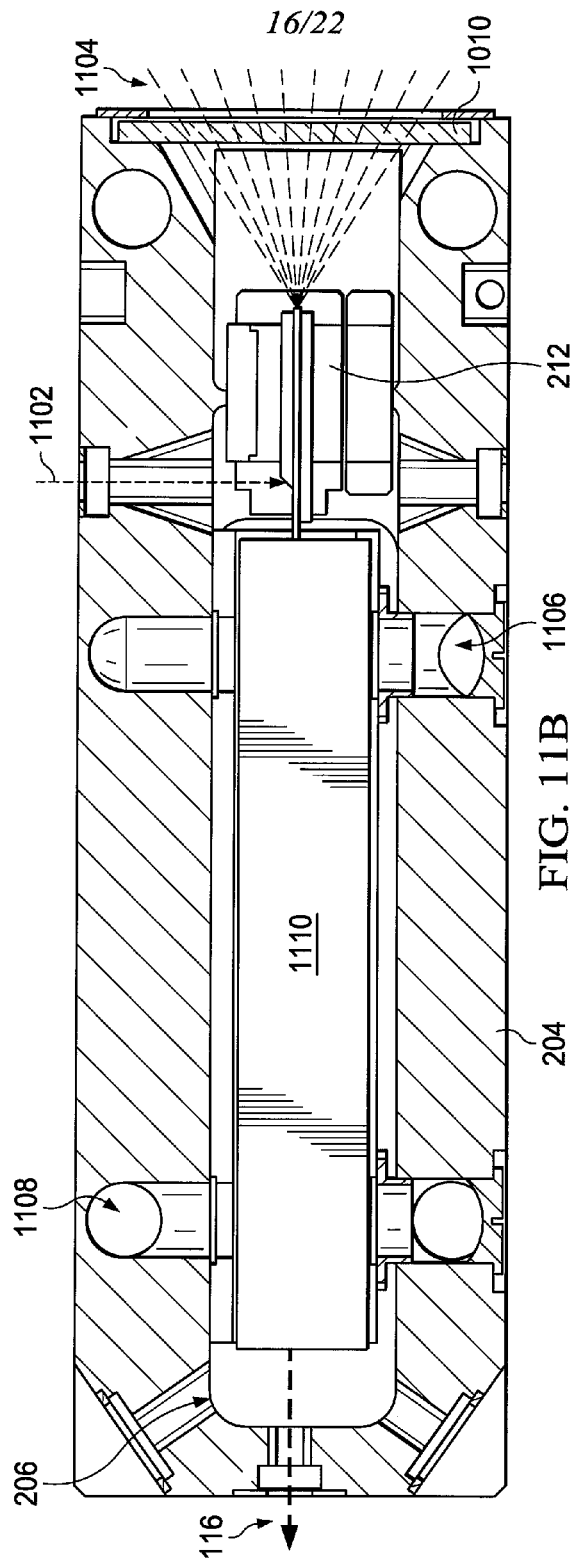

FIGS. 11A and 11B illustrate an example PWG pumphead assembly 308 of a packaged high-power laser system 200 according to this disclosure. FIG. 11A shows an isometric view of the PWG pumphead assembly 308, which includes the PWG pumphead housing 204, the window 1010, and the cover 902 encasing the PWG cartridge 206. As shown in FIG. 11B, a beam 1102 from the master oscillator 102 and beams 1104 from the laser diode pump arrays 208 are provided to the PWG cartridge 206, and the PWG cartridge 206 operates to generate the high-power output beam 116. The PWG cartridge 206 includes a planar waveguide 1110, which denotes the lasing medium for the PWG pumphead assembly 308. The PWG pumphead housing 204 also includes channels 1106-1108 that support coolant flow through the PWG pumphead assembly 308. These channels 1106-1108 could, for instance, align with the channel 714-716 described above.

Figure 12A:
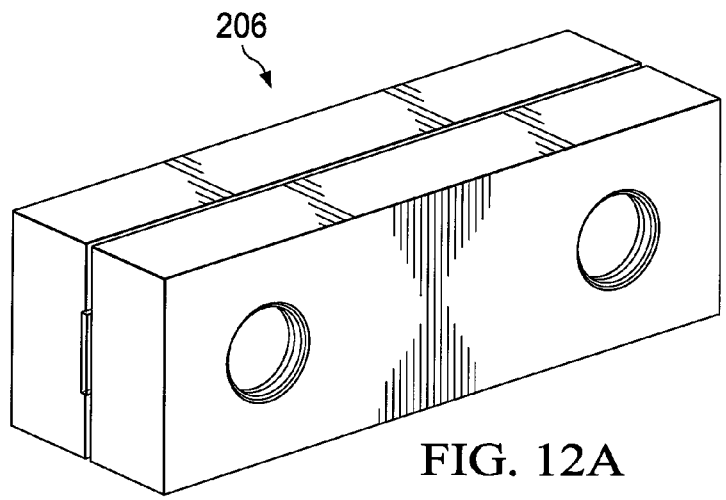
FIGS. 12A and 12B illustrate an example PWG cartridge for a PWG pumphead assembly of a packaged high-power laser system according to this disclosure.
Figure 12B:
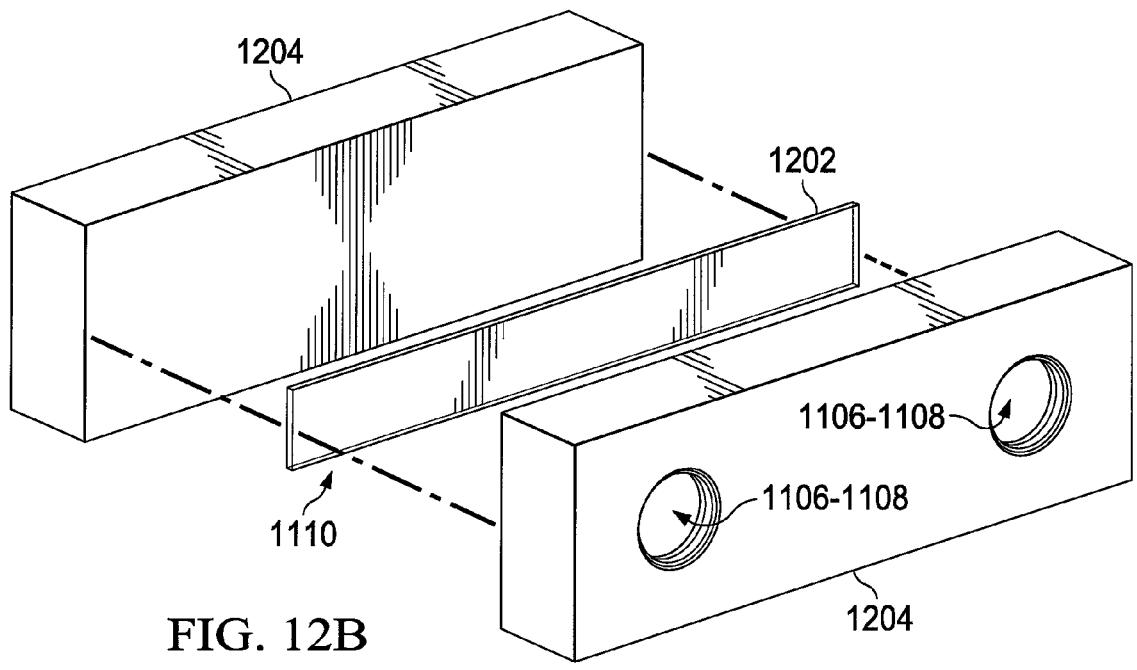

FIGS. 12A and 12B illustrate an example PWG cartridge 206 for a PWG pumphead assembly 308 of a packaged high-power laser system 200 according to this disclosure. As shown in FIGS. 12A and 12B, the PWG cartridge 206 includes the planar waveguide 1110. The planar waveguide 1110 has at least one TOI material 1202 placed in thermal contact with the broad clad faces of the planar waveguide 1110. The exposed sides of the TOI material 1202 can be bonded or otherwise attached to one or more coolers 1204, such as by using a thermally conducting epoxy. The coolers 1204 include the channels 1106-1108 and are used to transport coolant to cool the PWG cartridge 206. The TOI material 1202 includes any suitable material facilitating the transport of heat away from a planar waveguide. Each cooler 1204 includes any suitable structure for removing heat from a planar waveguide. In some embodiments, for example, each cooler 1204 could denote a copper microchannel heatsink module.

Figure 13:
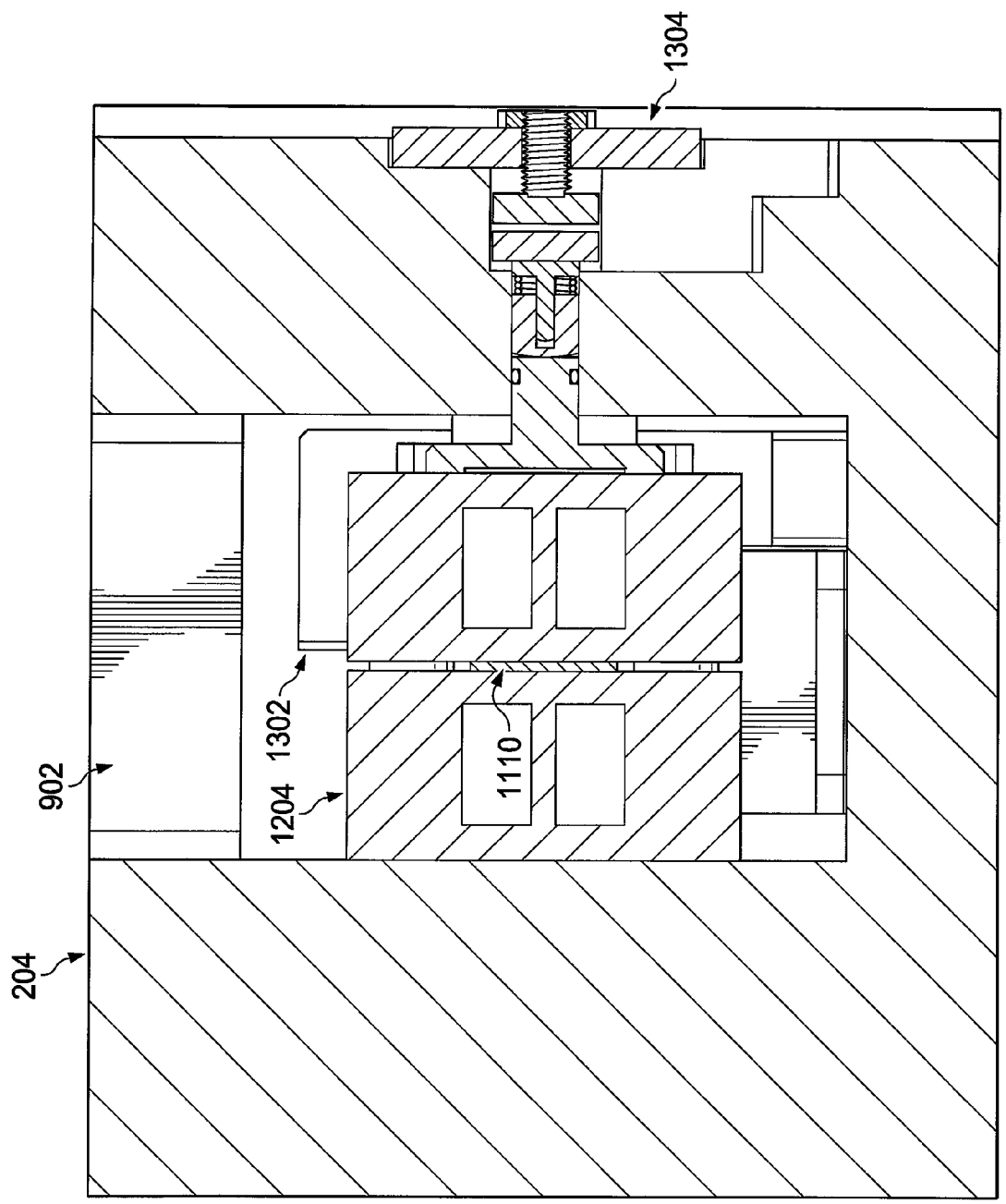
FIG. 13 illustrates an example pumphead configuration with an example PWG cartridge for a packaged high-power laser system according to this disclosure.

FIG. 13 illustrates an example pumphead configuration with an example PWG cartridge 206 for a packaged high-power laser system 200 according to this disclosure. As shown in FIG. 13, the PWG pumphead housing 204 is used to hold the PWG cartridge 206, which includes the planar waveguide 1110 and the coolers 1204. The PWG cartridge 206 is held in place using one or more pusher assemblies 1302 in the PWG pumphead housing 204. A main body of the housing 204 could be formed from an integral piece of material, and the cover 902 can provide access to the interior of the housing 204. A cover 1304 allows a portion of the pusher assembly 1302 to extend out of the housing 204 so that the pusher assembly 1302 can be adjusted. The pusher assemblies 1302 push inward (to the left in FIG. 13) in order to secure the PWG cartridge 206 in place. Each pusher assembly 1302 includes any suitable structure for applying force against a PWG cartridge. Each cover 1304 includes any suitable structure allowing passage of a portion of at least one pusher assembly.

Figure 14A:
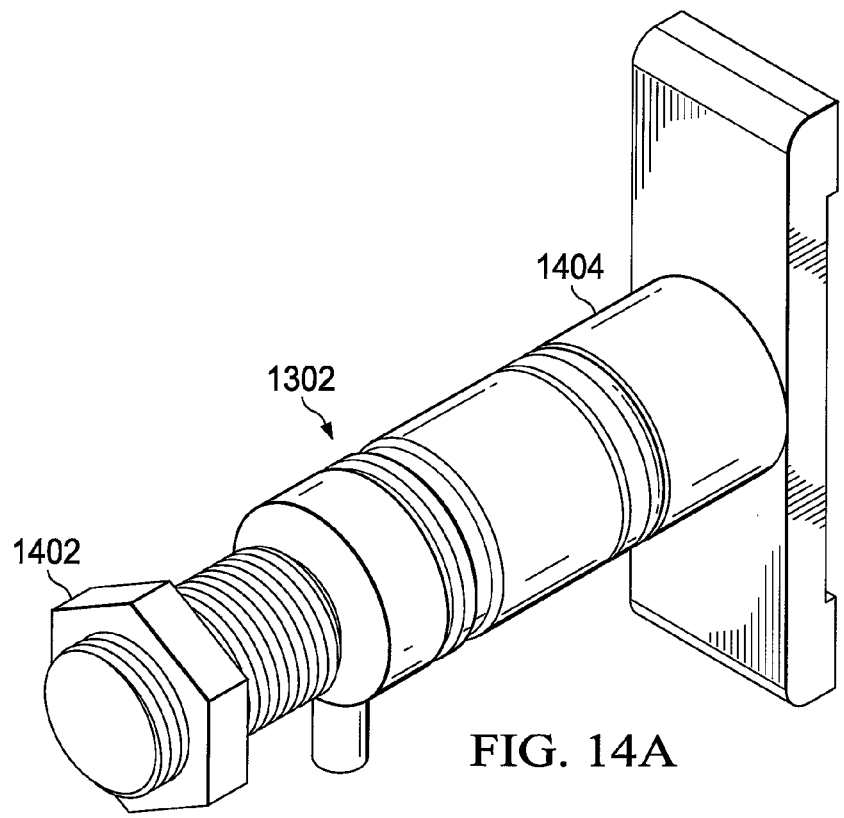
FIGS. 14A and 14B illustrate an example pusher assembly for use with a PWG pumphead assembly of a packaged high-power laser system according to this disclosure.
Figure 14B:
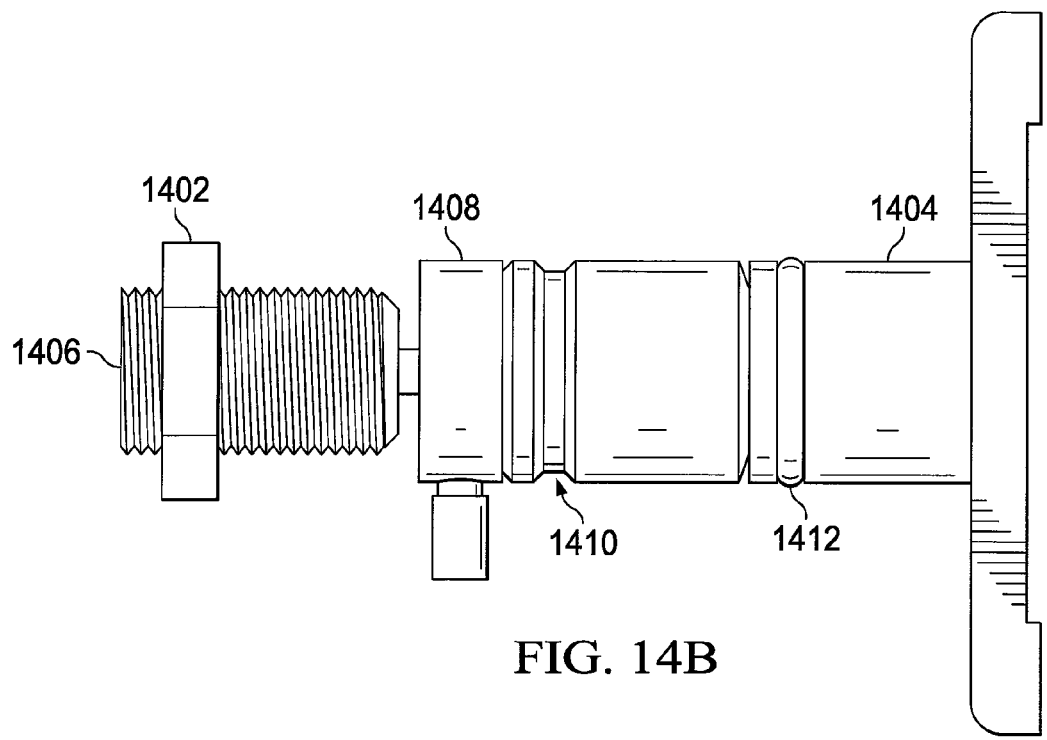

FIGS. 14A and 14B illustrate an example pusher assembly 1302 for use with a PWG pumphead assembly 308 of a packaged high-power laser system 200 according to this disclosure. As shown here, the pusher assembly 1302 includes a nut 1402 at one end of the pusher assembly 1302 and a bridge 1404 at the opposite end of the pusher assembly 1302. As can be seen in FIG. 13, the nut 1402 can remain accessible along an outer surface of the PWG pumphead housing 204, while the bridge 1404 can contact the PWG cartridge 206. Rotating the nut 1402 either increases or decreases the pressure placed on the PWG cartridge 206 by the bridge 1404. Each pusher assembly 1302 provides a uniform and controlled pressure onto the PWG cartridge 206, such as up to 200 pounds per square inch or more. This can be done in a compliant manner to compensate for changes in temperature in the housing 204. The nut 1402 and the bridge 1404 could each be formed from any suitable material(s) and in any suitable manner.

The pusher assembly 1302 also includes a threaded structure 1406 and a compression sensor 1408. The threaded structure 1406 denotes any suitable threaded device on which the nut 1402 can be located. For example, the threaded structure 1406 could represent a 0.375-24 set screw or other screw reworked to have a flat point. The compression sensor 1408 detects an amount of compression applied against the compression sensor 1408, which can vary depending on the position of the nut 1402 along the threaded structure 1406 when the pusher assembly 1302 is located within the PWG pumphead housing 204. The compression sensors 1408 in multiple pusher assemblies 1302 could be used to determine whether the pressures applied to the PWG cartridge 206 is substantially uniform along the length of the PWG cartridge 206. The compression sensor 1408 includes any suitable structure for measuring compression, such as an SB-250 sensor from TRANSDUCER TECHNIQUES, LLC.

The pusher assembly 1302 further includes a spring assembly 1410, which includes one or more belleville washers arranged on a thimble for alignment in this example. Any suitable number of belleville washers could be used, such as four. Note, however, that any other suitable spring assembly could be used here. In addition, the pusher assembly 1302 includes a seal 1412 around a neck of the bridge 1404. The seal 1412 helps to reduce or prevent leakage into or out of the interior space of the PWG pumphead housing 204. The seal 1412 includes any suitable structure for reducing or preventing fluid flow, such as an O-ring.

The design of the PWG pumphead assembly 308 here integrates the PWG lasing medium (the planar waveguide 1110), the TOI material 1202, and the PWG cooler(s) 1204 into a cartridge assembly (the cartridge 206). The PWG cartridge 206 can be supported by spring-loaded clamps implemented using the pusher assemblies 1302. The PWG cartridge 206 can also interface directly with the optical bench and cooling manifold 302 in order to receive coolant from the optical bench and cooling manifold 302 without requiring the use of external hoses or other plumbing. By building the cartridge 206 as a separate assembly, the lasing and cooling elements can be tailored to perform together, and the thermal and mechanical stresses can be minimized. Moreover, cartridge replacement may require minimal disassembly of the packaged laser system 200.

Figure 15:
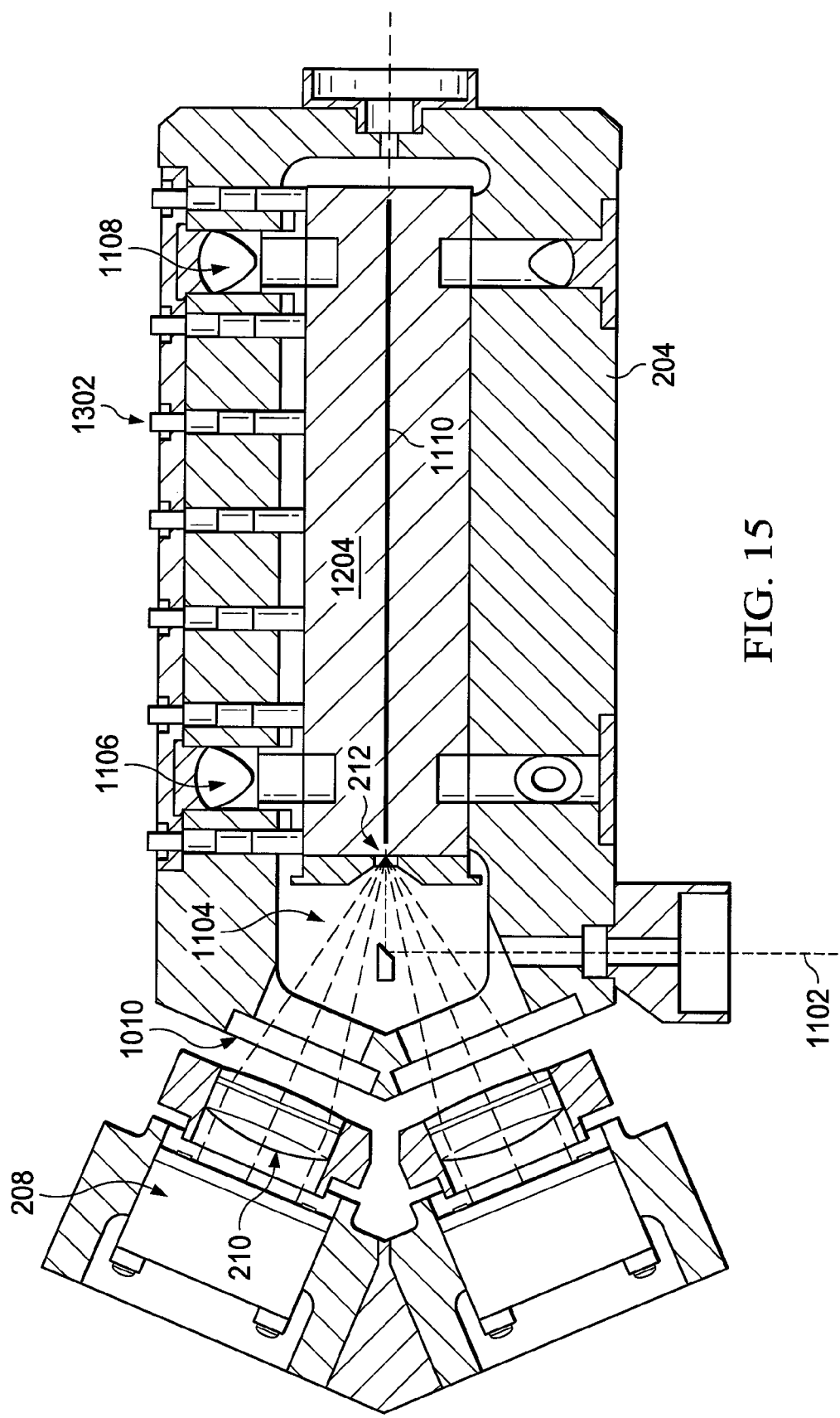
FIG. 15 illustrates example operation of a PWG amplifier of a packaged high-power laser system according to this disclosure.
Figure 16:
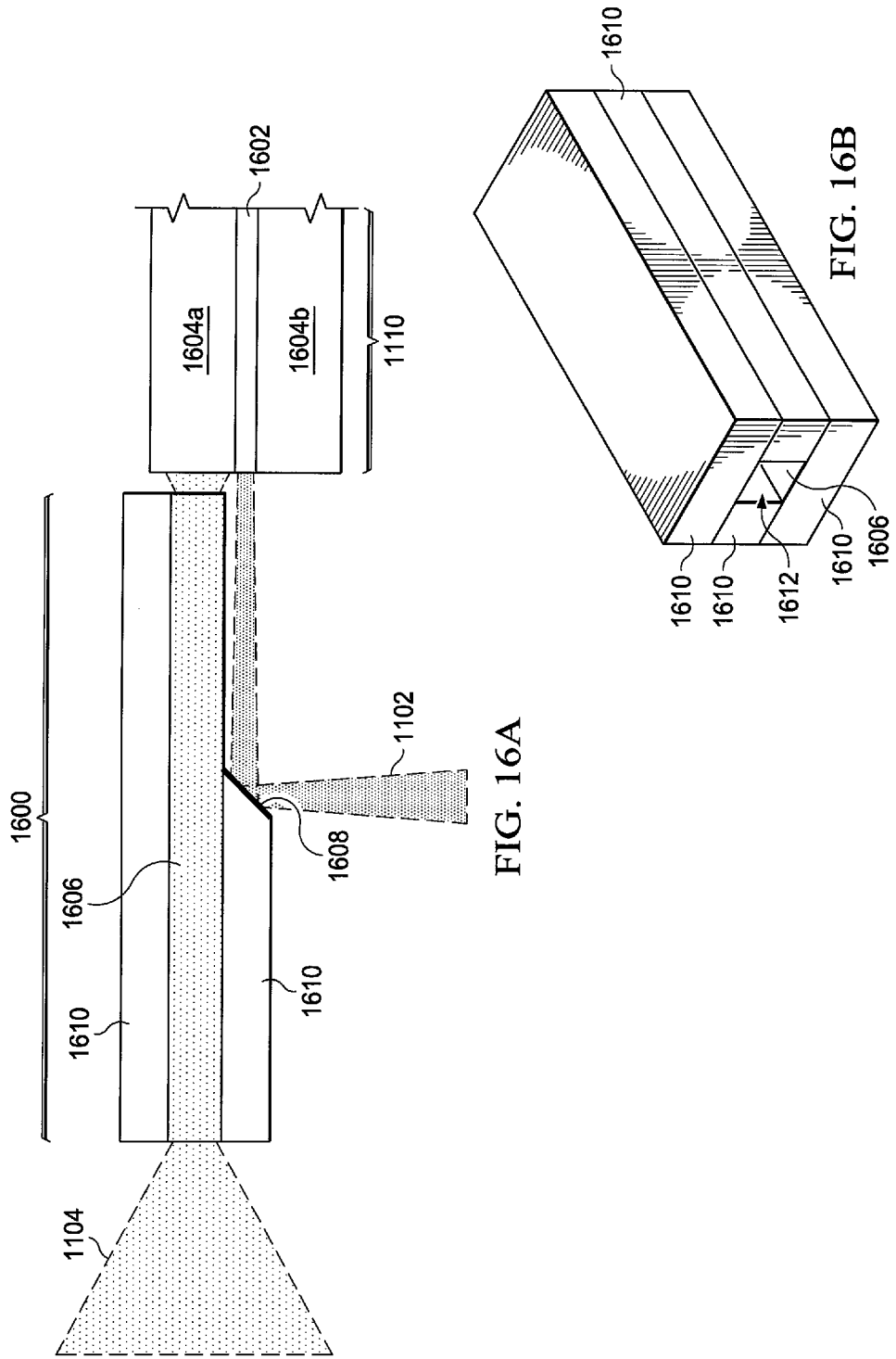
FIGS. 16A, 16B, and 17 illustrate example integral pump-light homogenizers and signal injectors of a packaged high-power laser system according to this disclosure.

FIG. 15 illustrates example operation of the PWG amplifier 104 of a packaged high-power laser system 200 according to this disclosure. As shown in FIG. 15, the beam 1102 from the master oscillator 102 and the beams 1104 from the laser diode pump arrays 208 are received at the planar waveguide 1110. The beam 1102 is coupled into the core region of the planar waveguide 1110, and the beams 1104 are coupled into the core region and/or cladding layer(s) of the planar waveguide 1110 via the light pipe 212. The cooling channels 1106-1108 extend through the PWG pumphead housing 204 and into the coolers 1204, and the pusher assemblies 1302 extend through the PWG pumphead housing 204 and secure the PWG cartridge 206 in place. The pusher assemblies 1302 also provide adequate force to prevent leakage of coolant from the cooling channels 1106-1108.

Although FIGS. 11A through 15 illustrate examples of a PWG amplifier 104 of a high-power laser system and components thereof, various changes may be made to FIGS. 11A through 15. For example, the sizes, shapes, and relative dimensions of the various components in FIGS. 11A through 15 are for illustration only. Also, the specific arrangements of components in FIGS. 11A through 15 could vary as needed or desired.

Figure 17:
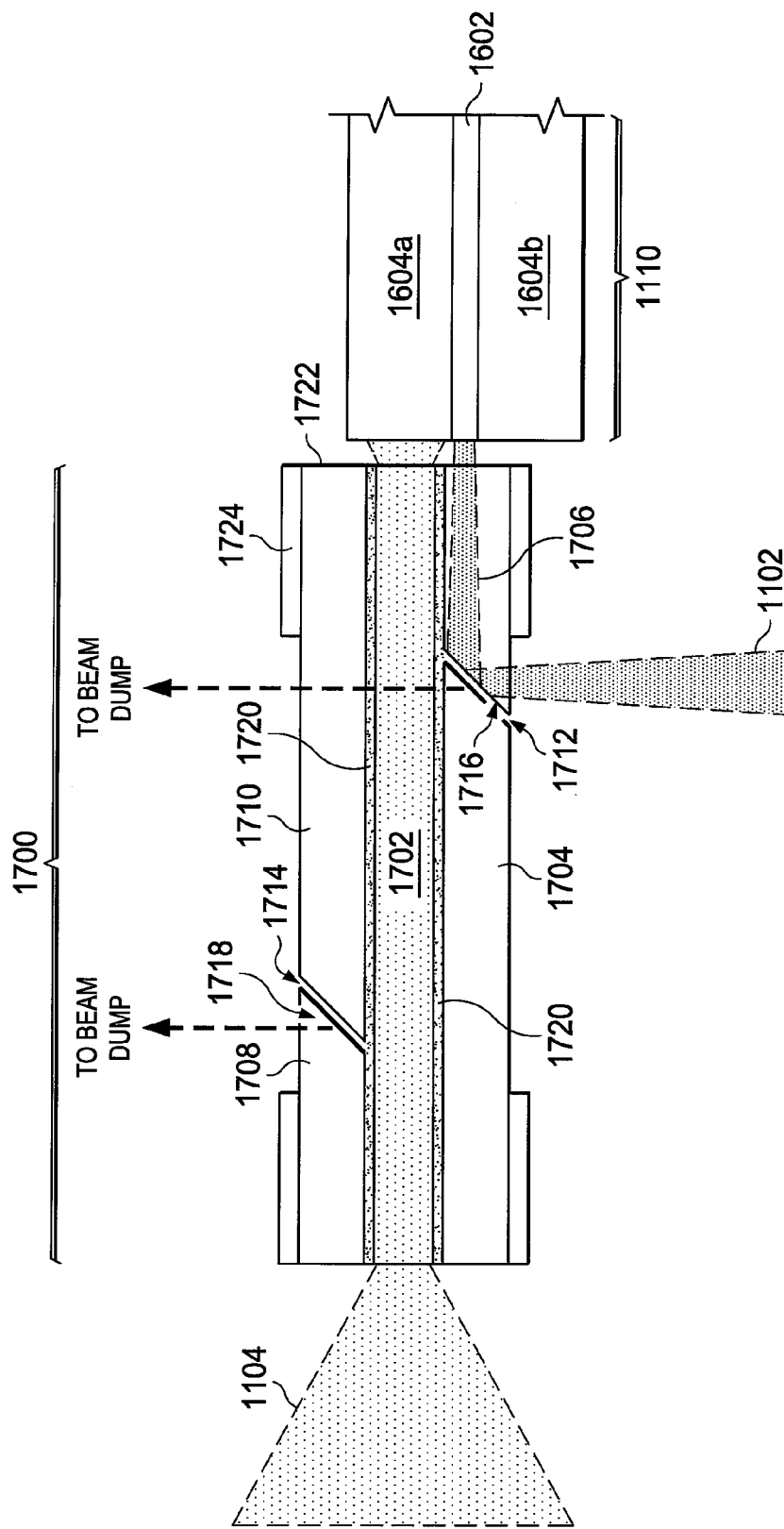

FIGS. 16A, 16B, and 17 illustrate example integral pumplight homogenizers and signal injectors 1600, 1650, and 1700 of a packaged high-power laser system 200 according to this disclosure. The pumplight homogenizers and signal injectors 1600, 1650, and 1700 could denote the optics used to couple light from optical pumping sources and the master oscillator's signal beam into a lasing medium.

As described in detail above, modern planar waveguide lasers include features to create a waveguide structure confining a laser beam in the thin dimension (the fast axis) of a PWG in order to maintain a high intensity along the gain path for high amplification factors and efficient extraction of stored energy. One or more lower index cladding layers are included on one or both sides of the core region to confine the laser beam in the core region and to confine pumplight within the cladding layer(s) and core region to allow efficient pumping along the entire length of the PWG.

The thin dimension of the fast axis presents several challenges in designing a high-power PWG laser. For example, pumplight needs to be focused into the thin dimension of the core/cladding with little overspill and with the proper beam entrance angles to allow total internal reflection (TIR) confinement of the pumplight within the larger guide defined by the outer surfaces of the cladding layers. At the entrance to the PWG, the pumplight needs to be reasonably uniform and not contain hot spots, which would degrade coatings and other surfaces. As another example, the signal beam from the master oscillator 102 needs to be formatted to fit the entrance aperture of the core region, and this beam needs to be aligned with the PWG and maintain alignment over time when subjected to severe temperature, shock, and vibration environments typical of some applications. In addition, any stray pumplight not coupled into the PWG needs to be managed and not allowed to be absorbed at uncooled surfaces, particularly near the PWG ends where there may be TOI materials that are highly absorbing or O-rings that are particularly susceptible to laser damage.

Conventional PWG laser designs often use simple focusing optics to relay pumplight directly into PWG core region and cladding layers. However, light from laser diode pump arrays does not necessarily have a uniform intensity distribution at the focus of the pump input optics and, by design, often underfills the entrance aperture of the PWG. This can result in significant intensity non-uniformities and hot spots where the pumplight is injected into the PWG cladding layer(s). "Power in the wings" of a focused pump spot can also result in overspill of the beam onto other structures, like TOI layers and coolers. Light baffles may be used to scrape and divert some of this pumplight overspill, but alignment of baffles is often difficult, and the location of the baffles may not permit complete suppression even with perfect alignment. Non-uniform heating at the end of a PWG can produce thermal gradients in the core region across the unguided direction, resulting in refractive index differences and optical path-length differences (OPD) across the output beam. The ramifications of pumplight non-uniformity, inadequate stray light management, and optical misalignments can include lower-than-predicted lasing efficiency, reduced output beam quality, degradation of components, and catastrophic damage.

Some conventional PWG amplifier designs use a small turning mirror located in close proximity to high-power pump beams to inject the signal beam from the master oscillator into the core region of a PWG. While effective, this requires precision alignment of an optic in a location with limited access due to its proximity to the high-power pump beams. Maintaining this type of precision alignment for this optic could be problematic in a number of applications.

The pumplight homogenizers and signal injectors 1600, 1650, and 1700 can help to overcome these or other problems. The pumplight homogenizers and signal injectors 1600, 1650, and 1700 form specialized light pipe assemblies for coupling pumplight from one or more laser diode pump arrays 208 into a high aspect ratio planar waveguide. These light pipe assemblies also help to strip off stray pumplight prior to coupling into the planar waveguide and provide highly-uniform pump beams at the planar waveguide's input, which reduces risk of coating damage and results in reduced wavefront distortion in the PWG amplifier. These light pipe assemblies further help to couple the signal beam from the master oscillator 102 into the PWG amplifier 104 without passing through the pump beams and provide highly-stable alignment of very closely spaced pump and signal beams. The pumplight homogenizers and signal injectors 1600, 1650, and 1700 can be placed within the PWG pumphead housing 204 (and therefore separated from the laser diode pump arrays 208 by the windows 1010), which helps to reduce or minimize contamination where beam intensity is greatest.

As shown in FIG. 16A, the planar waveguide 1110 includes a core region 1602 and one or more cladding layers 1604a-1604b. The core region and cladding layers are described above. In general, the signal from the master oscillator 102 is injected into the core region 1602, while power from the laser diode pump arrays 208 is injected into cladding layer(s) 1604a-1604b and/or the core region 1602.

In the example shown in FIG. 16A, pumplight from the laser diode pump arrays 208 (the beams 1104) is focused into the end of a prismatic or other optic 1606. The optic 1606 guides the pumplight along a guiding axis by total internal reflection. Optical coatings may be bonded or deposited along guiding surfaces of the optic 1606 to ensure total internal reflection and to protect surfaces from mechanical damage. Alternatively, low-index dielectric shims may be located over guiding surfaces of the optic 1606 to create a fluid-filled interface between the optic 1606 and prismatic or other optics 1610, where the fluid ensures total internal reflection. Example fluids include water, glycol-water mixtures, air, and helium. Examples of low-index dielectric shim materials include magnesium fluoride (MgF$_2$), fused silica, and sapphire. The pumplight rays bounce many times off the guiding surfaces so that the pumplight emerges substantially homogenized with no significant hot spots. The end of the optic 1606 is in close physical proximity to the end of the planar waveguide 1110 and is sized so that most or all pumplight is coupled into the core region 1602 and/or cladding layer(s) 1604a-1604b of the planar waveguide 1110 with negligible overspill.

The optic 1606 effectively contains the pumplight and the optics 1610 effectively strip off stray light, thereby minimizing any stray pumplight near the end of the planar waveguide 1110 and reducing or eliminating the need for other forms of stray pumplight management near the end of the planar waveguide 1110. In some embodiments, the ends of the optic 1610 contain reflective coatings or anti-reflective coatings. In other embodiments, the ends of the optic 1610 are ground or polished. Also, in some embodiments, the optic 1606 extends across substantially the full width of the planar waveguide's slow axis to provide substantially uniform pumping of the core region 1602, thereby minimizing temperature non-uniformities and associated thermal lensing that causes wavefront error and degrades beam quality in the amplified laser beam at the output end of the planar waveguide 1110.

The signal beam 1102 from the master oscillator 102 is formatted by the external relay optics 110 and is folded and injected into the core region 1602 of the planar waveguide 1110 off a reflective surface 1608 of the optic 1610. The reflective surface 1608 could have any suitable angle with respect to the longitudinal axis of the planar waveguide 1110, such as a nominal angle of 45°, which allows the signal beam 1102 to be introduced from the side of the pumphead assembly 308.

Each optic 1606 and 1610 includes any suitable structure for providing desired optical modifications, such as mixing or reflection. The reflective surface 1608 includes any suitable structure reflective to at least the signal beam from a master oscillator. In some embodiments, the optic 1606 denotes the core of a light pipe, and the optics 1610 denote a portion of the cladding around the core of the light pipe.

If the optic 1606 is uncoated, the optics 1610 can have a sufficiently lower index of refraction to allow total internal reflection at the most extreme pumplight ray angles. The optics 1606 and 1610 could have various other coatings or features as needed or desired. For example, evanescent wave (e-wave) coatings may be applied to the guiding surfaces of the optic 1606, or side faces of the optic 1606 could be coated to allow guiding in the lateral slow-axis direction. Anti-reflection (AR) coatings may be applied to any or all input or output faces of the optics 1610 to improve efficiency and minimize stray light reflections. Scraper mirrors, scattering surfaces, and/or cooled absorbers may be used at the entrance to the optic 1606 to catch any stray light emanating from the laser diode pump arrays 208 and other sources, such as reflections of stray light from other reflective or scattering surfaces within the pumphead assembly 308. Mounts and other surfaces that are not actively cooled may be coated with a high reflectivity coating such as gold, and surfaces that are actively cooled may be coated with an absorbing material to manage heat from stray pumplight.

FIG. 16B illustrates a specific implementation of the structure shown in FIG. 16A. More specifically, the pumplight homogenizer and signal injector 1650 in FIG. 16B includes the optic 1606 and the optics 1610. In some embodiments, the optic 1606 in FIG. 16B can be formed using a hollow space containing a fluid, such as water, glycol-water mixtures, air, helium, or gas, or an evacuated space. Inner surfaces 1612 of the optics 1610 denote highly reflective surfaces, which form two sets of substantially parallel reflective surfaces. The reflective surfaces 1612 could be formed in any suitable manner, such as by using a gold or other highly-reflective coating. Again, the optic 1606 effectively contains the pumplight and the optics 1610 effectively strip off stray light, thereby minimizing any stray pumplight near the end of the planar waveguide 1110 and reducing or eliminating the need for other forms of stray pumplight management near the end of the planar waveguide 1110.

As shown in FIG. 17, the pumplight homogenizer and signal injector 1700 includes an optic 1702 and an optic 1704, which could be the same as or similar to the corresponding components 1606 and 1610 described above. Here, however, the signal beam 1102 from the master oscillator 102 passes through a third optic 1706 prior to injection into the core region 1602 of the planar waveguide 1110. Additional optics 1708-1710 can optionally be located on the other side of the optic 1702.

An air gap 1712 separates the optics 1704-1706, and an air gap 1714 separates the optics 1708-1710. The air gaps 1712-1714 have different indexes of refraction compared to the optics 1704-1710, creating areas 1716-1718 of total internal reflection. Among other things, these areas 1716-1718 allow stray pumplight to be diverted to one or more beam dumps.

Various optional features described above with respect to FIGS. 16A and 16B are also shown in FIG. 17, although one, some, or all of these features could be omitted from FIG. 17 if desired. These features include e-wave coatings 1720 for guiding pumplight and AR coatings 1722 at the end surfaces for improved coupling of pumplight and master oscillator signals into and out of the pumplight homogenizer and signal injector 1700. In addition, one or more heat rejection surfaces 1724 could run laterally near the input or output ends of the pumplight homogenizer and signal injector 1700 to help remove heat from the pumplight homogenizer and signal injector 1700.

The pumplight homogenizers and signal injectors 1600, 1650, and 1700 here could support integral construction where pumplight and signal beam apertures are aligned with the planar waveguide 1110 in a single manufacturing step. As a result, external alignment of only the beams from the master oscillator 102 and the pump optics assembly 306 may be required. Moreover, beam alignment can be inherently preserved over time under severe environmental conditions without maintenance.

Although FIGS. 16A, 16B, and 17 illustrate examples of integral pumplight homogenizers and signal injectors 1600, 1650, and 1700 of a packaged high-power laser system 200, various changes may be made to FIGS. 16A, 16B, and 17. For example, while the pumplight homogenizers and signal injectors 1600, 1650, and 1700 are shown here as being substantially solid, various other types of light pipe assemblies could be supported. As a particular example, a hollow light pipe with specialized thin film coatings for providing light guiding functionality could be used in place of the optic 1606 or 1702. Also, it is possible for a light pipe to support signal injector and light scraping functions without requiring support for a homogenizing function.

High-power laser systems, such as the ones described above, could be used in a large number of military and commercial applications. The following discussion provides a description of various example commercial applications. However, the following discussion does not limit this disclosure to any particular applications.

High-power laser systems could find use in commercial mining applications, such as in drilling, mining, or coring operations. For instance, high-power laser systems could be used to soften or weaken an earth bed prior to drilling through the earth bed using drill bits. This could allow for fewer drill bit changes and extended lifetimes and reliabilities of the drill bits. Here, free-space propagation of a high-power laser beam from an output window of a laser system could be used, allowing deeper penetration at further distances compared to conventional fiber lasers.

High-power and high-beam quality laser systems could also find use in remote laser welding, cutting, drilling, or heat treating operations, such as in industrial or other automation settings. The use of a high-power and high-beam quality laser system allows the processing of thicker materials to occur at larger working distances from the laser system while minimizing the heat-affected zone and maintaining vertical or other cut lines. Among other things, this helps to support welding or cutting operations where proximity to the weld or cut site is difficult or hazardous. It also helps to protect the laser system and possibly any human operators from smoke, debris, or other harmful materials.

High-power laser systems could further find use in construction and demolition operations. Example operations could include metal resurfacing or deslagging, paint removal, and industrial demolition operations. High-power laser systems can be used to ablate material much faster and safer compared to conventional operations. As a particular example of this functionality, high-power laser systems could be used to support demolition of nuclear reactors or other hazardous structures. Here, the high-power laser systems could be used to cut through contaminated structures like contaminated concrete or nuclear containment vessels or reactors from long distances. This helps to avoid the use of water jet cutting or other techniques that create hazardous waste, such as contaminated water. It also provides improved safety since human operators can remain farther away from contaminated structures being demolished.

A number of additional applications are possible. For example, high-power laser systems could find use in power beaming applications, where high-power laser beams are targeted to photovoltaic (solar) cells of remote devices to be recharged. High-power laser systems could find use in hazardous material (HAZMAT) applications, where the laser systems are used to heat and decompose hazardous materials into less harmful or non-harmful materials.

The following describes example features and implementations of a high-power laser system and related components according to this disclosure. However, other features and implementations of a high-power laser system and related components could be used.

In a first embodiment, a method includes generating a low-power optical beam using a master oscillator and amplifying the low-power optical beam to generate a high-power optical beam using a PWG. The high-power optical beam has a power of at least about ten kilowatts and is generated using a single laser gain medium in the PWG amplifier.

Any single one or any combination of the following features could be used with the first embodiment. The single laser gain medium could lie within a single amplifier beamline of a laser system. The master oscillator and the PWG amplifier could be coupled to an optical bench assembly. The optical bench assembly could include optics configured to route the low-power optical beam to the PWG amplifier and to route the high-power optical beam from the PWG amplifier. The PWG amplifier could include (i) a cartridge that contains the single laser gain medium and (ii) a pumphead housing that retains the cartridge. The pumphead housing could be coupled to input and output optics assemblies in order to maintain optical alignment. The method could also include controlling operation of the master oscillator and the PWG amplifier using a laser controller and performing one or more BIT routines to monitor a health, status, or safety of a laser system that includes the master oscillator and the PWG amplifier. The method could further include generating pumplight for the PWG amplifier using one or more laser diode pump arrays and coupling substantially all of the pumplight into the laser gain medium. In addition, the method could include at least one of (i) performing adaptive optics control using a laser controller to alter at least one of the low-power optical beam and the high-power optical beam and (ii) performing two-axis tip/tilt alignment control using the laser controller. The single laser gain medium in the PWG amplifier could include a planar waveguide. The planar waveguide could include a core region and at least one cladding layer contacting the core region.

In a second embodiment, a system includes a master oscillator configured to generate a low-power optical beam and a PWG amplifier configured to receive the low-power optical beam and generate a high-power optical beam having a power of at least about ten kilowatts. The PWG amplifier includes a single laser gain medium configured to generate the high-power optical beam.

Any single one or any combination of the following features could be used with the second embodiment. The single laser gain medium could reside within a single amplifier beamline of the system. The master oscillator and the PWG amplifier could be coupled to an optical bench assembly. The optical bench assembly could include optics configured to route the low-power optical beam to the PWG amplifier and to route the high-power optical beam from the PWG amplifier. The PWG amplifier could include (i) a cartridge that contains the single laser gain medium and (ii) a housing that retains the cartridge. The housing could be coupled to input and output optics assemblies in order to maintain optical alignment. The system could also include a laser controller configured to control operation of the master oscillator and the PWG amplifier and to perform one or more BIT routines to monitor a health, status, or safety of the system. The system could further include one or more laser diode pump arrays configured to generate pumplight for the laser gain medium and optics configured to couple substantially all of the pumplight into the laser gain medium. In addition, the system could include a laser controller configured to at least one of (i) perform adaptive optics control to alter at least one of the low-power optical beam and the high-power optical beam and (ii) perform two-axis tip/tilt alignment control. The single laser gain medium in the PWG amplifier could include a planar waveguide. The planar waveguide could include a core region and at least one cladding layer contacting the core region.

In a third embodiment, an apparatus includes a PWG amplifier configured to receive a low-power optical beam from a master oscillator and generate a high-power optical beam having a power of at least about ten kilowatts. The PWG amplifier includes a single laser gain medium configured to generate the high-power optical beam.

Any single one or any combination of the following features could be used with the third embodiment. The PWG amplifier could include (i) a cartridge containing the single laser gain medium and (ii) a pumphead housing configured to receive and retain the cartridge. The pumphead housing could be configured to be coupled to input and output optics assemblies in order to maintain optical alignment. The single laser gain medium in the PWG amplifier could include a planar waveguide. The planar waveguide could include a core region and at least one cladding layer contacting the core region.

In a fourth embodiment, a system includes a master oscillator configured to generate a low-power optical beam. The system also includes a PWG amplifier having one or more laser diode pump arrays, a planar waveguide, and a light pipe. The one or more laser diode pump arrays are configured to generate pumplight. The planar waveguide is configured to generate a high-power optical beam using the low-power optical beam and the pumplight. The light pipe is configured to substantially homogenize the pumplight and to inject the homogenized pumplight into the planar waveguide. The light pipe is also configured to inject the low-power optical beam into the planar waveguide.

Any single one or any combination of the following features could be used with the fourth embodiment. The light pipe could form a pumplight aperture and a low-power optical beam aperture that are aligned with the planar waveguide. The light pipe could include a core with a first optic configured to guide the pumplight along a guiding axis. The first optic could be configured to deliver the pumplight substantially homogenized into the planar waveguide. The light pipe could also include a cladding with a second optic having a reflective surface, and the reflective surface could be configured to reflect the low-power optical beam into the planar waveguide. Alternatively, the light pipe could also include a cladding with second and third optics separated from one another by a first gap, the first gap could form a first area of reflection, and the first area of reflection could be configured to reflect the low-power optical beam into the planar waveguide and to reflect stray pumplight toward a first beam dump. The cladding of the light pipe could further include fourth and fifth optics separated from one another by a second gap, the second gap could form a second area of reflection, and the second area of reflection could be configured to reflect stray pumplight toward a second beam dump. Alternatively, the light pipe could include at least two sets of substantially parallel reflective surfaces and a core located between the sets of reflective surfaces, where the core is configured to guide the pumplight along a guiding axis and deliver the pumplight substantially homogenized into the planar waveguide. The core could include a gas-filled space. The light pipe could also include at least one of one or more evanescent wave coatings applied to one or more surfaces of the light pipe, one or more anti-reflection coatings applied to one or more input or output faces of the light pipe, and one or more heat rejection surfaces extending laterally near one or more input or output ends of the light pipe.

In a fifth embodiment, an apparatus includes a light pipe configured to substantially homogenize pumplight from one or more laser diode pump arrays and to inject the homogenized pumplight into a planar waveguide of a PWG amplifier. The light pipe is also configured to inject a low-power optical beam from a master oscillator into the planar waveguide.

Any single one or any combination of the following features could be used with the fifth embodiment. The light pipe could form a pumplight aperture and a low-power optical beam aperture that are configured to align with the planar waveguide. The light pipe could include a core with a first optic configured to guide the pumplight along a guiding axis. The first optic could be configured to deliver the pumplight substantially homogenized into the planar waveguide. The light pipe could also include a cladding with a second optic having a reflective surface, and the reflective surface could be configured to reflect the low-power optical beam into the planar waveguide. Alternatively, the light pipe could also include a cladding with second and third optics separated from one another by a first gap, the first gap could form a first area of reflection, and the first area of reflection could be configured to reflect the low-power optical beam into the planar waveguide and to reflect stray pumplight toward a first beam dump. The cladding of the light pipe could further include fourth and fifth optics separated from one another by a second gap, the second gap could form a second area of reflection, and the second area of reflection could be configured to reflect stray pumplight toward a second beam dump. Alternatively, the light pipe could include at least two sets of substantially parallel reflective surfaces and a core located between the sets of reflective surfaces, where the core is configured to guide the pumplight along a guiding axis and deliver the pumplight substantially homogenized into the planar waveguide. The light pipe could also include at least one of one or more evanescent wave coatings applied to one or more surfaces of the light pipe, one or more anti-reflection coatings applied to one or more input or output faces of the light pipe, and one or more heat rejection surfaces extending laterally near one or more input or output ends of the light pipe.

In a sixth embodiment, a method includes generating a low-power optical beam using a master oscillator and generating pumplight using one or more laser diode pump arrays. The method also includes generating a high-power optical beam based on the low-power optical beam and the pumplight using a planar waveguide of a PWG amplifier. The method further includes using a light pipe to substantially homogenize the pumplight, to inject the homogenized pumplight into the planar waveguide, and to inject the low-power optical beam into the planar waveguide.

Any single one or any combination of the following features could be used with the sixth embodiment. The light pipe could include a core with a first optic configured to guide the pumplight along a guiding axis. The first optic could be configured to deliver the pumplight substantially homogenized into the planar waveguide. The light pipe could also include a cladding with a second optic having a reflective surface, and the reflective surface could be configured to reflect the low-power optical beam into the planar waveguide. Alternatively, the light pipe could also include a cladding with second and third optics separated from one another by a first gap, the first gap could form a first area of reflection, and the first area of reflection could be configured to reflect the low-power optical beam into the planar waveguide and to reflect stray pumplight toward a first beam dump. The cladding of the light pipe could further include fourth and fifth optics separated from one another by a second gap, the second gap could form a second area of reflection, and the second area of reflection could be configured to reflect stray pumplight toward a second beam dump. Alternatively, the light pipe could include at least two sets of substantially parallel reflective surfaces and a core located between the sets of reflective surfaces, where the core is configured to guide the pumplight along a guiding axis and deliver the pumplight substantially homogenized into the planar waveguide.

In a seventh embodiment, an apparatus includes a light pipe configured to pass pumplight from one or more laser diode pump arrays and to inject the pumplight into a planar waveguide of a PWG amplifier. The light pipe is also configured to inject a low-power optical beam from a master oscillator into the planar waveguide. The light pipe is further configured to scrape stray pumplight so that the stray pumplight is redirected away from the planar waveguide.

Any single one or any combination of the following features could be used with the seventh embodiment. The light pipe could include a core having a first optic configured to guide the pumplight along a guiding axis and to deliver the pumplight into the planar waveguide. The light pipe could also include a cladding with a second optic having a first reflective surface configured to reflect the low-power optical beam into the planar waveguide and a second reflective surface configured to reflect the stray pumplight away from the planar waveguide.

In an eighth embodiment, an apparatus includes a PWG pumphead configured to receive a low-power optical beam and generate a high-power optical beam. The PWG pumphead includes a laser gain medium, a cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, and the cartridge is removable from the housing.

Any single one or any combination of the following features could be used with the eighth embodiment. The apparatus could also include spring-loaded clamps configured to secure the cartridge within the pumphead housing. The spring-loaded clamps could include pusher assemblies. The pusher assemblies could be configured to provide controlled and substantially uniform pressure onto the cartridge. Each pusher assembly could include a bridge configured to contact the cartridge, a spring assembly coupled to the bridge, and a compression sensor configured to measure an amount of pressure applied to the cartridge. The pumphead housing could also include a cover having multiple viewing ports. The viewing ports could be configured to pass infrared radiation from different portions of the laser gain medium. The laser gain medium could include a planar waveguide. The planar waveguide could include a core region and at least one cladding layer contacting the core region. The PWG pumphead could be configured to direct stray pumplight that fails to couple into the planar waveguide to at least one beam dump. The pumphead housing could be configured to be coupled to input optics and output optics to maintain optical alignment of the PWG pumphead with the input and output optics. The one or more cooling channels could be configured to receive the coolant from an optical bench and cooling manifold and to return the coolant to the optical bench and cooling manifold.

In a ninth embodiment, a system includes a laser system having a master oscillator and a PWG amplifier having one or more laser diode pump arrays, a PWG pumphead, input optics, and output optics. The PWG pumphead is configured to receive a low-power optical beam from the master oscillator and generate a high-power optical beam. The PWG pumphead includes a laser gain medium, a cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, where the cartridge is removable from the housing.

Any single one or any combination of the following features could be used with the ninth embodiment. The PWG pumphead could also include spring-loaded clamps configured to secure the cartridge within the pumphead housing. The spring-loaded clamps could include pusher assemblies. Each pusher assembly could include a bridge configured to contact the cartridge, a spring assembly coupled to the bridge, and a compression sensor configured to measure an amount of pressure applied to the cartridge. The pumphead housing could also include a cover having multiple viewing ports. The viewing ports could be configured to pass infrared radiation from different portions of the laser gain medium. The system could also include relay optics configured to couple pumplight from the one or more laser diode pump arrays into the PWG pumphead. The laser gain medium could include a planar waveguide. The planar waveguide could include a core region and at least one cladding layer contacting the core region. The PWG pumphead could be configured to direct stray pumplight that fails to couple into the planar waveguide to at least one beam dump. The pumphead housing could be configured to be coupled to input optics and output optics to maintain optical alignment of the PWG pumphead with the input and output optics. The one or more cooling channels could be configured to receive the coolant from an optical bench and cooling manifold and to return the coolant to the optical bench and cooling manifold. The master oscillator, the one or more laser diode pump arrays, the PWG pumphead, the input optics, and the output optics could be modular.

In a tenth embodiment, a method includes inserting a cartridge into a PWG pumphead of a laser system. The PWG pumphead is configured to receive a low-power optical beam and generate a high-power optical beam. The PWG pumphead includes a laser gain medium, the cartridge, and a pumphead housing. The cartridge is configured to receive and retain the laser gain medium, and the cartridge includes one or more cooling channels configured to transport coolant in order to cool the laser gain medium. The pumphead housing is configured to receive and retain the cartridge, and the cartridge is removable from the housing.

Any single one or any combination of the following features could be used with the tenth embodiment. The method could also include removing the cartridge from the pumphead housing and inserting a different cartridge containing a different laser gain medium into the housing. The method could further include securing the cartridge within the pumphead housing using spring-loaded clamps.

In an eleventh embodiment, a system includes a laser system having a master oscillator and a PWG amplifier having one or more laser diode pump arrays, a pumphead, input optics, and output optics. The system also includes an optical bench and cooling manifold coupled to the pumphead. The optical bench and cooling manifold is configured to provide coolant to the one or more laser diode pump arrays and the pumphead through the optical bench and cooling manifold. The optical bench and cooling manifold is also configured to partially deform during operation of the laser system. A housing of the pumphead is coupled to the input and output optics to maintain optical alignment of the pumphead with the input and output optics.

Any single one or any combination of the following features could be used with the eleventh embodiment. The optical bench and cooling manifold could be configured such that thermal stresses in the optical bench and cooling manifold arising from changes in temperature of the coolant as the coolant flows through the optical bench and cooling manifold are substantially balanced in order to maintain linear and angular alignment between critical components of the laser system along critical axes of the laser system. The optical bench and cooling manifold could be configured to undergo thermal expansion and thermal contraction that create motion of non-critical components of the laser system and that create relative motion between the critical components of the laser system in non-critical axes of the laser system. Critical components of the laser system could be kinematically mounted to support alignment along critical axes of the laser system. The optical bench and cooling manifold could be coupled to the pumphead on a first side of the optical bench and cooling manifold. The optical bench and cooling manifold could include a first recess in an opposing second side of the optical bench and cooling manifold. The first recess could be configured to receive the master oscillator. The optical bench and cooling manifold could also include a second recess in the first side of the optical bench and cooling manifold. The second recess could be configured to receive the one or more laser diode pump arrays. The master oscillator, the one or more laser diode pump arrays, the pumphead, the input optics, and the output optics could be modular.

In a twelfth embodiment, an apparatus is configured for use with a laser system. The apparatus includes an optical bench and cooling manifold configured to provide coolant to (i) one or more laser diode pump arrays and (ii) a housing of a PWG pumphead that is coupled to input and output optics to maintain optical alignment of the housing with the input and output optics. The optical bench and cooling manifold is configured to be coupled to the housing without coupling to the input and output optics. The optical bench and cooling manifold is also configured to partially deform during operation of the laser system.

Any single one or any combination of the following features could be used with the twelfth embodiment. The optical bench and cooling manifold could be configured such that thermal stresses in the optical bench and cooling manifold arising from changes in temperature of the coolant as the coolant flows through the optical bench and cooling manifold are substantially balanced in order to maintain linear and angular alignment between critical components of the laser system along critical axes of the laser system. The optical bench and cooling manifold could be configured to undergo thermal expansion and thermal contraction that create motion of non-critical components of the laser system and that create relative motion between the critical components of the laser system in non-critical axes of the laser system. The optical bench and cooling manifold could be configured to be coupled to the pumphead on a first side of the optical bench and cooling manifold. The optical bench and cooling manifold could include a first recess in an opposing second side of the optical bench and cooling manifold. The first recess could be configured to receive a master oscillator of the laser system. The optical bench and cooling manifold could also include a second recess in the first side of the optical bench and cooling manifold. The second recess could be configured to receive the one or more laser diode pump arrays. The optical bench and cooling manifold could include a first passageway configured to receive the coolant through an inlet, a first channel configured to provide the coolant from the first passageway to multiple laser diode pump arrays, conduits configured to receive the coolant from the multiple laser diode pump arrays, second channels configured to receive the coolant from the conduits, second passageways configured to receive the coolant from the second channels, third channels configured to receive the coolant from the second passageways and provide the coolant to the pumphead, fourth channels configured to receive the coolant from the pumphead, and a third passageway configured to receive the coolant from the fourth channels and provide the coolant to an outlet. The first, second, and third passageways could extend along a length of the optical bench and cooling manifold. The first, second, third, and fourth channels could extend through the optical bench and cooling manifold.

In a thirteenth embodiment, a method includes operating a laser system having a master oscillator and a PWG amplifier having one or more laser diode pump arrays, a pumphead, input optics, and output optics. The pumphead is coupled to an optical bench and cooling manifold. The method also includes providing coolant to the one or more laser diode pump arrays and the pumphead through the optical bench and cooling manifold. The optical bench and cooling manifold is configured to partially deform during operation of the laser system. A housing of the pumphead is coupled to the input and output optics to maintain optical alignment of the pumphead with the input and output optics.

Any single one or any combination of the following features could be used with the thirteenth embodiment. The optical bench and cooling manifold could be configured such that thermal stresses in the optical bench and cooling manifold arising from changes in temperature of the coolant as the coolant flows through the optical bench and cooling manifold are substantially balanced in order to maintain linear and angular alignment between critical components of the laser system along critical axes of the laser system. The optical bench and cooling manifold could be configured to undergo thermal expansion and thermal contraction that create motion of non-critical components of the laser system and that create relative motion between the critical components of the laser system in non-critical axes of the laser system. Critical components of the laser system could be kinematically mounted to support alignment along critical axes of the laser system. The optical bench and cooling manifold could be coupled to the pumphead on a first side of the optical bench and cooling manifold. The optical bench and cooling manifold could include a first recess in an opposing second side of the optical bench and cooling manifold. The first recess could be configured to receive the master oscillator. The optical bench and cooling manifold could also include a second recess in the first side of the optical bench and cooling manifold. The second recess could be configured to receive the one or more laser diode pump arrays. The master oscillator, the one or more laser diode pump arrays, the pumphead, the input optics, and the output optics could be modular.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. §112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. §112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a planar waveguide (PWG) pumphead configured to receive a low-power optical beam and generate a high-power optical beam, wherein the PWG pumphead comprises:
a laser gain medium;
a cartridge configured to receive the laser gain medium and to retain the laser gain medium within the cartridge, the cartridge comprising cooling channels configured to transport coolant along opposite sides of the laser gain medium in order to cool the laser gain medium; and
a pumphead housing configured to receive and retain the cartridge, wherein the cartridge is removable from the housing.

2. An apparatus comprising:
a planar waveguide (PWG) pumphead configured to receive a low-power optical beam and generate a high-power optical beam, wherein the PWG pumphead comprises:
a laser gain medium;
a cartridge configured to receive and retain the laser gain medium, the cartridge comprising one or more cooling channels configured to transport coolant in order to cool the laser gain medium;
a pumphead housing configured to receive and retain the cartridge, wherein the cartridge is removable from the housing; and
spring-loaded clamps configured to secure the cartridge within the pumphead housing.

3. The apparatus of claim 2, wherein the spring-loaded clamps comprise pusher assemblies, the pusher assemblies configured to provide controlled and substantially uniform pressure onto the cartridge.

4. The apparatus of claim 3, wherein each pusher assembly comprises:
a bridge configured contact the cartridge;
a spring assembly coupled to the bridge; and
a compression sensor configured to measure an amount of pressure applied to the cartridge.

5. An apparatus comprising:
a planar waveguide (PWG) pumphead configured to receive a low-power optical beam and generate a high-power optical beam, wherein the PWG pumphead comprises:
a laser gain medium;
a cartridge configured to receive and retain the laser gain medium, the cartridge comprising one or more cooling channels configured to transport coolant in order to cool the laser gain medium; and
a pumphead housing configured to receive and retain the cartridge, wherein the cartridge is removable from the housing;
wherein the pumphead housing comprises a cover having multiple viewing ports, the viewing ports configured to pass infrared radiation from different portions of the laser gain medium.

6. The apparatus of claim 1, wherein:
the laser gain medium comprises a planar waveguide, the planar waveguide comprising a core region and at least one cladding layer contacting the core region; and
the PWG pumphead is configured to direct stray pumplight that fails to couple into the planar waveguide to at least one beam dump.

7. The apparatus of claim 1, wherein the pumphead housing is configured to be coupled to input optics and output optics to maintain optical alignment of the PWG pumphead with the input and output optics.

8. The apparatus of claim 1, wherein the cooling channels are configured to receive the coolant from an optical bench and cooling manifold and to return the coolant to the optical bench and cooling manifold.

9. A system comprising:
a laser system comprising a master oscillator and a planar waveguide (PWG) amplifier comprising a PWG pumphead, input optics, and output optics;
wherein the PWG pumphead is configured to receive a low-power optical beam from the master oscillator and generate a high-power optical beam; and
wherein the PWG pumphead comprises:
a laser gain medium;
a cartridge configured to receive the laser gain medium and to retain the laser gain medium within the cartridge, the cartridge comprising cooling channels configured to transport coolant along opposite sides of the laser gain medium in order to cool the laser gain medium; and
a pumphead housing configured to receive and retain the cartridge, wherein the cartridge is removable from the housing.

10. A system comprising:
a laser system comprising a master oscillator and a planar waveguide (PWG) amplifier comprising a PWG pumphead, input optics, and output optics;
wherein the PWG pumphead is configured to receive a low-power optical beam from the master oscillator and generate a high-power optical beam; and
wherein the PWG pumphead comprises:
a laser gain medium;
a cartridge configured to receive and retain the laser gain medium, the cartridge comprising one or more cooling channels configured to transport coolant in order to cool the laser gain medium;
a pumphead housing configured to receive and retain the cartridge, wherein the cartridge is removable from the housing; and
spring-loaded clamps configured to secure the cartridge within the pumphead housing.

11. The system of claim 10, wherein the spring-loaded clamps comprise pusher assemblies, each pusher assembly comprising:
a bridge configured to contact the cartridge;
a spring assembly coupled to the bridge; and
a compression sensor configured to measure an amount of pressure applied to the cartridge.

12. A system comprising:
a laser system comprising a master oscillator and a planar waveguide (PWG) amplifier comprising a PWG pumphead, input optics, and output optics;
wherein the PWG pumphead is configured to receive a low-power optical beam from the master oscillator and generate a high-power optical beam;
wherein the PWG pumphead comprises:
a laser gain medium;
a cartridge configured to receive and retain the laser gain medium, the cartridge comprising one or more cooling channels configured to transport coolant in order to cool the laser gain medium; and
a pumphead housing configured to receive and retain the cartridge, wherein the cartridge is removable from the housing; and wherein the pumphead housing comprises a cover having multiple viewing ports, the viewing ports configured to pass infrared radiation from different portions of the laser gain medium.

13. The system of claim 9, further comprising:
relay optics configured to couple pumplight from one or more laser diode pump arrays into the PWG pumphead.

14. The system of claim 13, wherein:
the laser gain medium comprises a planar waveguide, the planar waveguide comprising a core region and at least one cladding layer contacting the core region; and
the PWG pumphead is configured to direct stray pumplight that fails to couple into the planar waveguide to at least one beam dump.

15. The system of claim 9, wherein the pumphead housing is configured to be coupled to the input and output optics to maintain optical alignment of the PWG pumphead with the input and output optics.

16. The system of claim 9, wherein the cooling channels are configured to receive the coolant front an optical bench and cooling manifold and to return the coolant to the optical bench and cooling manifold.

17. The system of claim 9, wherein the master oscillator, one or more laser diode pump arrays, the PWG pumphead, the input optics, and the output optics are modular.

18. A method comprising:
inserting a cartridge into a planar waveguide (PWG) pumphead of a laser system, the PWG pumphead configured to receive a low-power optical beam and generate a high-power optical beam;
wherein the cartridge is configured to receive a laser gain medium and to retain the laser gain medium within the cartridge, the cartridge comprising cooling channels configured to transport coolant along opposite sides of the laser gain medium in order to cool the laser gain medium; and
wherein the PWG pumphead comprises a pumphead housing configured to receive and retain the cartridge, wherein the cartridge is removable from the housing.

19. The method of claim 18, further comprising:
removing the cartridge from the pumphead housing; and
inserting a different cartridge containing a different laser gain medium into the housing.

20. A method comprising:
inserting a cartridge into a planar waveguide (PWG) pumphead of a laser system, the PWG pumphead configured to receive a low-power optical beam and generate a high-power optical beam, wherein:
the cartridge is configured to receive and retain a laser gain medium;
the cartridge comprises one or more cooling channels configured to transport coolant in order to cool the laser gain medium;
a pumphead housing of the PWG pumphead is configured to receive and retain the cartridge; and
the cartridge is removable from the housing; and
securing the cartridge within the pumphead housing using spring-loaded clamps.

* * * * *